US012756377B2

(12) United States Patent
Hsiao et al.

(10) Patent No.: US 12,756,377 B2
(45) Date of Patent: Oct. 6, 2026

(54) SURFACE-ACOUSTIC-WAVE RESONATOR AND FILTER UTILIZING EFFECTIVE REFLECTING STRUCTURE

(71) Applicant: TAI-SAW Technology Co., Ltd., Taoyuan City (TW)

(72) Inventors: Chih-Chung Hsiao, Taoyuan City (TW); Bao-De Huang, Taoyuan City (TW)

(73) Assignee: TAI-SAW TECHNOLOGY CO., LTD., Taoyuan City (TW)

( * ) Notice: Subject to any disclaimer, the term of this patent is extended or adjusted under 35 U.S.C. 154(b) by 1057 days.

(21) Appl. No.: 17/945,707

(22) Filed: Sep. 15, 2022

(65) Prior Publication Data

US 2023/0078097 A1 Mar. 16, 2023

(30) Foreign Application Priority Data

Sep. 16, 2021 (TW) ................................ 110134701

(51) Int. Cl.
*H03H 9/25* (2006.01)
*H03H 9/02* (2006.01)
*H03H 9/145* (2006.01)

(52) U.S. Cl.
CPC .......... *H03H 9/25* (2013.01); *H03H 9/02992* (2013.01); *H03H 9/14541* (2013.01)

(58) Field of Classification Search
CPC ................. H03H 9/25; H03H 9/02992; H03H 9/14541
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 7,671,705 | B2 | 3/2010 | Nakazawa et al. | |
| 2019/0131954 | A1* | 5/2019 | Okada ................ | H03H 9/02992 |
| 2021/0126624 | A1 | 4/2021 | Hiramatsu et al. | |
| 2021/0313961 | A1* | 10/2021 | Huck ....................... | H03H 9/25 |

* cited by examiner

*Primary Examiner* — Derek J Rosenau
(74) *Attorney, Agent, or Firm* — Ryder, Mazzeo & Konieczny LLC

(57) ABSTRACT

An interdigital transducer for a surface-acoustic-wave resonator includes a conductive grid and a plurality of practical electrodes. The conductive grid includes a bus bar, a plurality of dummy electrodes and a conductive bar. The bus bar has a signal transmission terminal, and is disposed on a first side of the first conductive grid. The plurality of dummy electrodes directly extend from the bus bar. The conductive bar is disposed on a second side of the first conductive grid, and is opposite to the bus bar. Each of the plurality of practical electrodes extends from the conductive bar.

20 Claims, 19 Drawing Sheets

SURFACE-ACOUSTIC-WAVE RESONATOR AND FILTER UTILIZING EFFECTIVE REFLECTING STRUCTURE

CROSS-REFERENCE TO RELATED APPLICATION AND CLAIM OF PRIORITY

The application claims the benefit of Taiwan Patent Application No. 110134701, filed on Sep. 16, 2021, at the Taiwan Intellectual Property Office, the disclosures of which are incorporated herein in their entirety by reference.

TECHNICAL FIELD

The present disclosure is related to a resonator and a filter and, more particularly, is related to a Surface-Acoustic-Wave (SAW) resonator and a SAW filter, which utilize an effective reflecting structure.

BACKGROUND

SAW technology has many different applications in radio electronics and the Radio Frequency (RF) field. A SAW resonator using SAW technology can be applied to a signal filtering operation. Please refer to FIG. 1, which is a schematic diagram showing a SAW resonator 100 in the prior art. The SAW resonator 100 is disposed on a piezoelectric substrate 110, and includes an interdigital transducer 120, a reflector 130 and a reflector 140 being opposite to the reflector 130.

Please refer to FIG. 2, which is a schematic diagram showing a signal power of the SAW resonator 100 shown in FIG. 1. As shown in FIG. 2, the SAW resonator 100 is used for a SAW filter, and has a lower cutoff frequency FC1, an upper cutoff frequency FC2, and a resonance frequency range RH1 between the lower cutoff frequency FC1 and the upper cutoff frequency FC2. The SAW filter has a representative operation frequency of 2442 MHz. An output power of the SAW resonator 100 has a relatively large power variation in the resonance frequency range RH1. In order to reduce the relatively large power variation, there is a demand to improve a prior-art SAW resonator.

U.S. Pat. No. 7,671,705 B2 discloses a SAW filter and resonator, which utilizes a branch electrode with an electrically opened end.

SUMMARY OF EXEMPLARY EMBODIMENTS

It is one aspect of the present disclosure to provide a SAW resonator including an interdigital transducer. The interdigital transducer has a conductive grid to improve output power stability in a resonance frequency range of the SAW resonator.

It is therefore one embodiment of the present disclosure to provide a surface-acoustic-wave (SAW) resonator. The SAW resonator includes a substrate and an interdigital transducer. The interdigital transducer is disposed on the substrate, and includes a first conductive grid and a first plurality of practical electrodes. The first conductive grid includes a first bus bar, a first plurality of dummy electrodes, a first conductive bar and a first plurality of inner bars. The first bus bar has a first signal transmission terminal, and is disposed on a first side of the first conductive grid. The first plurality of dummy electrodes directly extend from the first bus bar. The first conductive bar is disposed on a second side of the first conductive grid, and is opposite to the first bus bar. The first plurality of inner bars are disposed between the first bus bar and the first conductive bar. Each of the first plurality of practical electrodes extends from the first conductive bar.

It is therefore another embodiment of the present disclosure to provide a surface-acoustic-wave (SAW) resonator. The SAW resonator includes a substrate and an interdigital transducer. The interdigital transducer is disposed on the substrate, and includes a first conductive grid and a first plurality of practical electrodes. The first conductive grid includes a first bus bar, a first plurality of dummy electrodes, a first conductive bar and a first inner bar. The first bus bar has a first signal transmission terminal, and is disposed on a first side of the first conductive grid. The first plurality of dummy electrodes directly extend from the first bus bar. The first conductive bar is disposed on a second side of the first conductive grid, and is opposite to the first bus bar. The first inner bar is disposed between the first bus bar and the first conductive bar. Each of the first plurality of practical electrodes extends from the first conductive bar.

It is therefore another embodiment of the present disclosure to provide an interdigital transducer for a surface-acoustic-wave (SAW) resonator. The interdigital transducer includes a first conductive grid and a first plurality of practical electrodes. The first conductive grid includes a first bus bar, a first plurality of dummy electrodes and a first conductive bar. The first bus bar has a first signal transmission terminal, and is disposed on a first side of the first conductive grid. The first plurality of dummy electrodes directly extend from the first bus bar. The first conductive bar is disposed on a second side of the first conductive grid, and is opposite to the first bus bar. Each of the first plurality of practical electrodes extends from the first conductive bar.

It is therefore another embodiment of the present disclosure to provide a surface-acoustic-wave (SAW) filter. The SAW filter includes an interdigital transducer. The interdigital transducer includes a first conductive grid and a first plurality of practical electrodes. The first conductive grid includes a first bus bar, a first plurality of dummy electrodes and a first conductive bar. The first bus bar has a first signal transmission terminal, and is disposed on a first side of the first conductive grid. The first plurality of dummy electrodes directly extend from the first bus bar. The first conductive bar is disposed on a second side of the first conductive grid, and is opposite to the first bus bar. Each of the first plurality of practical electrodes extends from the first conductive bar.

BRIEF DESCRIPTION OF THE DRAWINGS

The foregoing and other features and advantages of the present disclosure will be more clearly understood through the following descriptions with reference to the drawings, wherein.

DETAILED DESCRIPTION OF THE PREFERRED EMBODIMENTS

The present disclosure will now be described more specifically with reference to the following embodiments. It is to be noted that the following descriptions of preferred embodiments of this disclosure are presented herein for the purposes of illustration and description only; they are not intended to be exhaustive or to be limited to the precise form disclosed.

Figure 3:
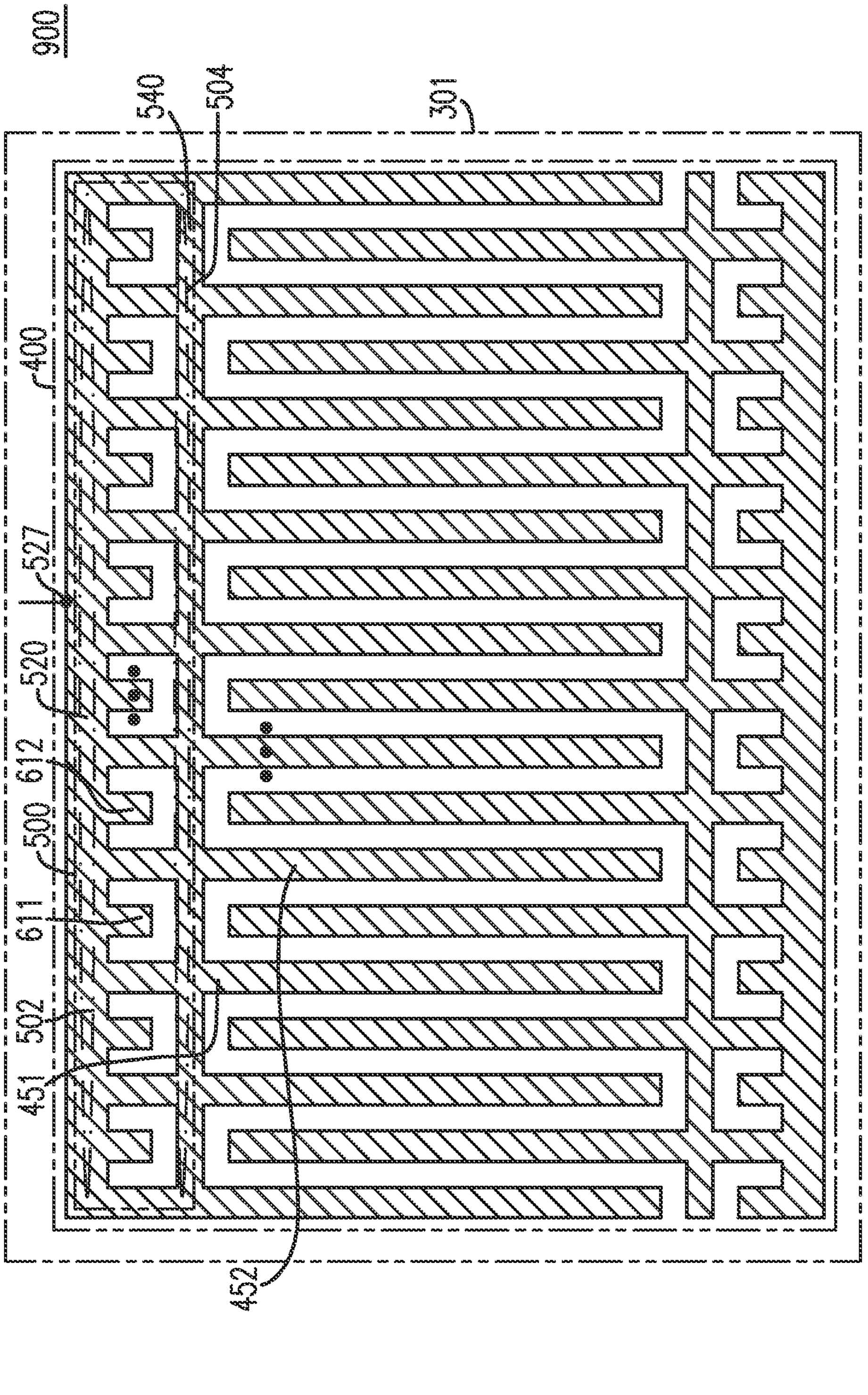
FIG. 3 is a schematic diagram showing a signal processing system according to various embodiments of the present disclosure.

Please refer to FIG. 3, which is a schematic diagram showing a signal processing system 900 according to various embodiments of the present disclosure. As shown in FIG. 3, the signal processing system 900 includes a surface-acoustic-wave (SAW) resonator 301. The SAW resonator 301 includes an interdigital transducer 400. The interdigital transducer 400 includes a first conductive grid 500 and a first plurality of practical electrodes 451, 452, . . . . The first conductive grid 500 includes a first bus bar 520 disposed on a first side 502 of the first conductive grid 500, a first plurality of dummy electrodes 611, 612, . . . directly extending from the first bus bar 520, and a first conductive bar 540 disposed on a second side 504 of the first conductive grid 500. The first bus bar 520 has a first signal transmission terminal 527. The first conductive bar 540 is opposite to the first bus bar 520; or the first conductive bar 540 is disposed on the second side 504 and is opposite to the first bus bar 520. Each of the first plurality of practical electrodes 451, 452, . . . extends from the first conductive bar 540.

Figure 4:
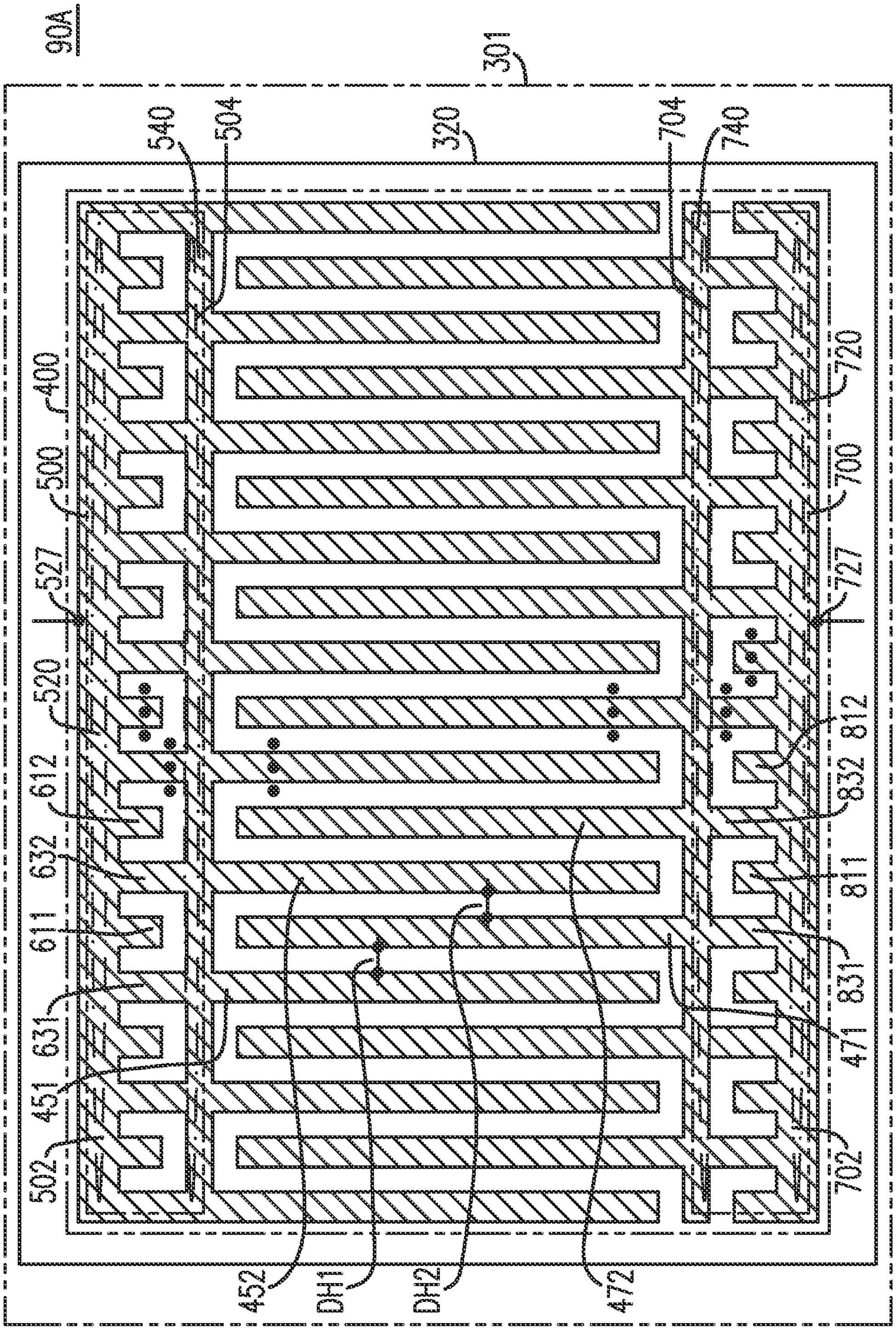
FIG. 4 is a schematic diagram showing an implementation structure of the signal processing system shown in FIG. 3.
Figure 5:
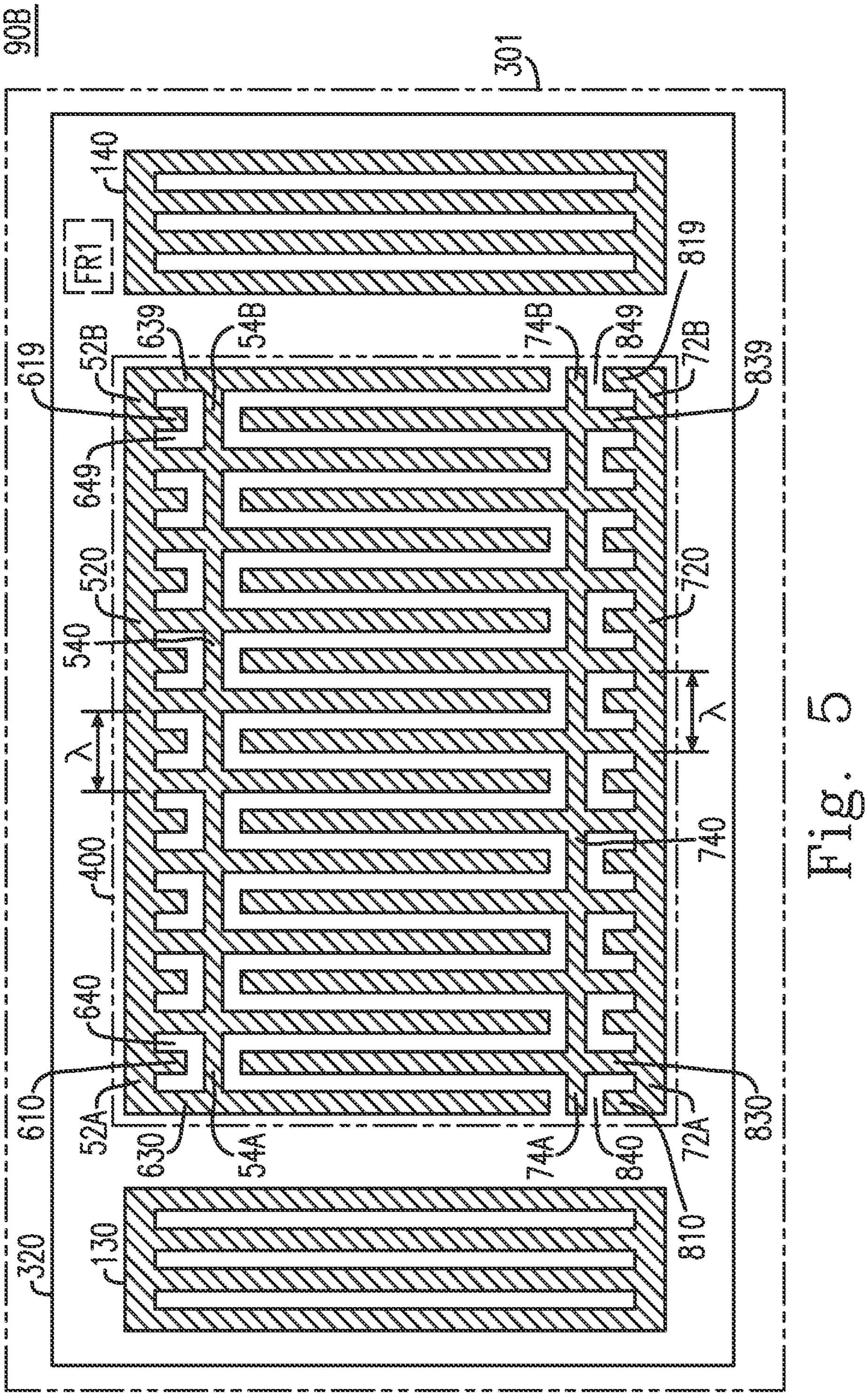
FIG. 5 is a schematic diagram showing an implementation structure of the signal processing system shown in FIG. 3.
Figure 6:
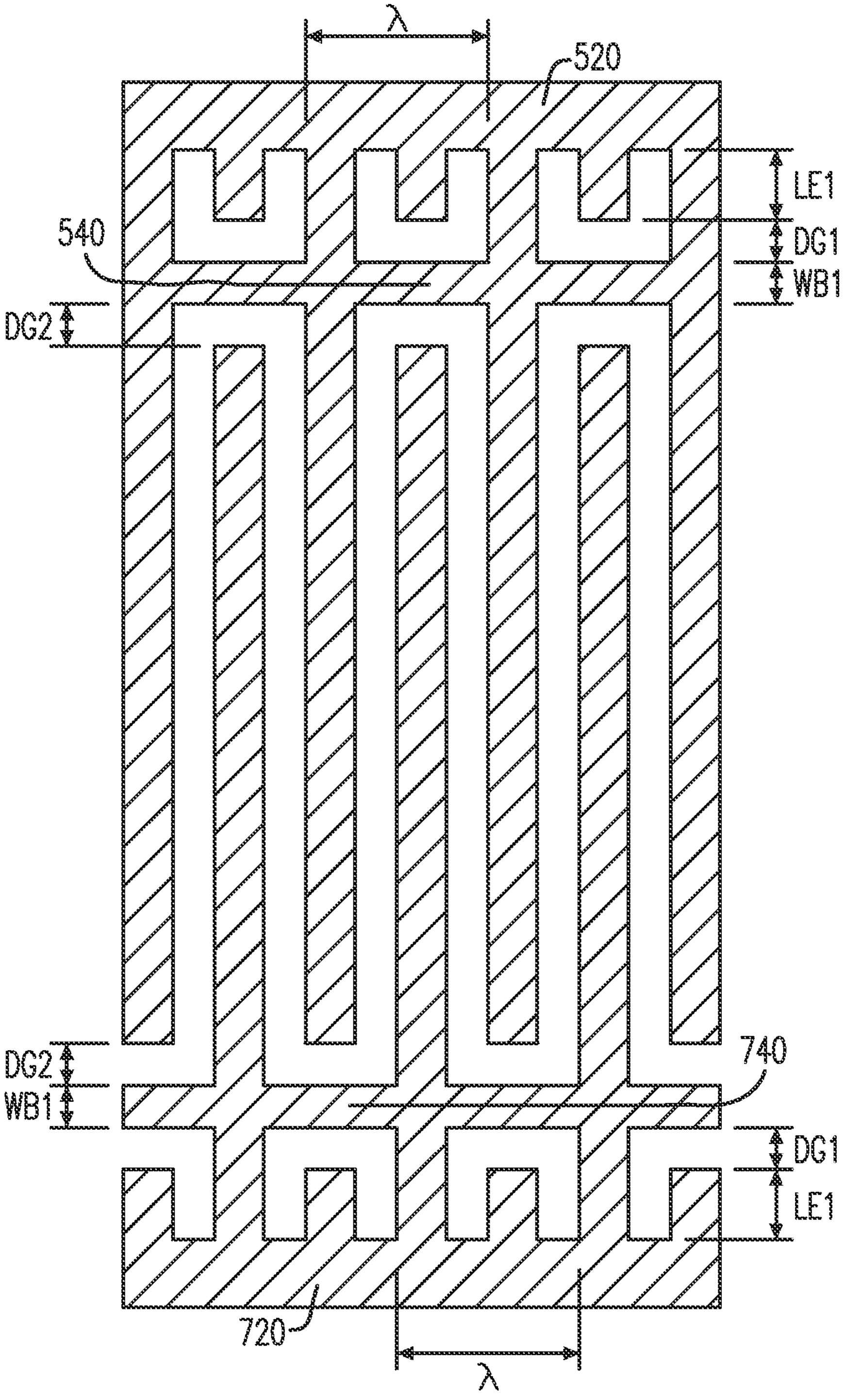
FIG. 6 is a schematic diagram showing a partial structure of an interdigital transducer shown in FIG. 3.

Please refer to FIG. 4, FIG. 5 and FIG. 6. FIG. 4 is a schematic diagram showing an implementation structure 90A of the signal processing system 900 shown in FIG. 3. FIG. 5 is a schematic diagram showing an implementation structure 90B of the signal processing system 900 shown in FIG. 3. FIG. 6 is a schematic diagram showing a partial structure of the interdigital transducer 400 shown in FIG. 3. As shown in FIG. 4 and FIG. 5, each of the implementation structure 90A and the implementation structure 90B includes the SAW resonator 301.

In some embodiments, the first conductive bar 540 is substantially parallel with the first bus bar 520. The first conductive grid 500 further includes a first plurality of conductive connection segments 631, 632, . . . . The first plurality of conductive connection segments 631, 632, . . . are disposed between the first bus bar 520 and the first conductive bar 540, are aligned with the first plurality of practical electrodes 451, 452, . . . respectively, and are interlaced with the first plurality of dummy electrodes 611, 612, . . . . For example, the first plurality of conductive connection segments 631, 632, . . . are electrically connected to the first bus bar 520 and the first conductive bar 540, and directly extend between the first bus bar 520 and the first conductive bar 540.

The interdigital transducer 400 is disposed on a piezoelectric substrate 320, and further includes a second conductive grid 700 and a second plurality of practical electrodes 471, 472, . . . . The second conductive grid 700 is opposite to the first conductive grid 500, and includes a second bus bar 720 disposed on a first side 702 of the second conductive grid 700, a second plurality of dummy electrodes 811, 812, . . . directly extending from the second bus bar 720, and a second conductive bar 740 disposed on a second side 704 of the second conductive grid 700. The second bus bar 720 has a second signal transmission terminal 727. The second conductive bar 740 is opposite to the second bus bar 720; or the second conductive bar 740 is disposed on the second side 704 and is opposite to the second bus bar 720. For example, the first and the second conductive bars 540 and 740 are respectively two reflecting bars. The second side 504 is opposite to the first side 502. The second side 704 is opposite to the first side 702. The first and the second conductive bars 540 and 740 can respectively serve two effective reflecting structures to cause the SAW resonator 301 to have desired output power stability in a resonance frequency range.

The second plurality of practical electrodes 471, j472, . . . all extend from the second conductive bar 740, and are interlaced with the first plurality of practical electrodes 451, 452, . . . . The second conductive bar 740 is substantially parallel with the second bus bar 720. The first plurality of dummy electrodes 611, 612, . . . are aligned with the second plurality of practical electrodes 471, 472, . . . respectively. The second plurality of dummy electrodes 811, 812, . . . are aligned with the first plurality of practical electrodes 451, 452, . . . respectively.

In some embodiments, the SAW resonator 301 further has a specific resonance frequency FR1. The second conductive grid 700 further includes a second plurality of conductive connection segments 831, 832, . . . . The second plurality of conductive connection segments 831, 832, . . . are disposed between the second bus bar 720 and the second conductive bar 740, are aligned with the second plurality of practical electrodes 471, 472, . . . respectively, and are interlaced with the second plurality of dummy electrodes 811, 812, . . . . The first plurality of practical electrodes 451, 452, . . . have a periodic electrode distance λ. For example, the second plurality of conductive connection segments 831, 832, . . . are electrically connected to the second bus bar 720 and the second conductive bar 740, and directly extend between the second bus bar 720 and the second conductive bar 740.

Each of the first plurality of dummy electrodes 611, 612, . . . and the first conductive bar 540 have a first gap distance DG1 therebetween which ranges from 0.0625λ to 0.5λ. The first conductive bar 540 and each of the second plurality of practical electrodes 471, 472, . . . have a second gap distance DG2 therebetween which ranges from 0.0625λ to 0.5λ. The specific resonance frequency FR1 ranges from 30 MHz to 6 GHz. Each of the first plurality of dummy electrodes 611, 612, . . . has an electrode length LE1 which ranges from 0.1λ to 5λ.

In some embodiments, the interdigital transducer 400 for the SAW resonator 301 includes the first conductive grid 500 and the first plurality of practical electrodes 451, 452, . . . . The SAW resonator 301 includes a substrate 320 and the interdigital transducer 400 disposed on the substrate 320. For example, the substrate 320 is a piezoelectric substrate.

In some embodiments, each of the second plurality of dummy electrodes 811, 812, . . . and the second conductive bar 740 have the first gap distance DG1 therebetween. The second conductive bar 740 and each of the first plurality of practical electrodes 451, 452, . . . have the second gap distance DG2 therebetween. The first plurality of practical electrodes 451, 452, . . . are a first plurality of electrode fingers. The second plurality of practical electrodes 471, 472, . . . are a second plurality of electrode fingers. The first plurality of practical electrodes 451, 452, . . . are mutually interlaced with the second plurality of practical electrodes 471, 472, . . . to form a plurality of interdigital electrode fingers.

The SAW resonator 301 has a SAW propagation direction. The first conductive bar 540 has a bar width WB1 and a first longitudinal direction. The bar width WB1 ranges from 0.0625λ to 0.5λ. The first longitudinal direction is substantially parallel with the SAW propagation direction. The second conductive bar 740 has the bar width WB1 and a second longitudinal direction. The second longitudinal direction is substantially parallel with the SAW propagation direction.

For example, the first plurality of practical electrodes 451, 452, . . . extend from the first conductive bar 540 in a first extension direction. The first extension direction is substantially perpendicular to the SAW propagation direction. The second plurality of practical electrodes 471, 472, . . . extend from the second conductive bar 740 in a second extension direction. The second extension direction is substantially perpendicular to the SAW propagation direction. The interdigital transducer 400 has a first outer side in the SAW propagation direction and a second outer side being opposite to the first outer side. The SAW resonator 301 further includes a reflector 130 disposed on the first outer side and a reflector 140 disposed on the second outer side. For example, the reflector 140 is opposite to the reflector 130, and matches the reflector 130.

The practical electrode 451 and the practical electrode 471 have a gap distance DH1 therebetween. The gap distance DH1 ranges from 0.0625λ to 0.5λ. The practical electrode 471 and the practical electrode 452 have a gap distance DH2 therebetween. The gap distance DH2 ranges from 0.0625λ to 0.5λ. For example, the gap distance DH2 is substantially equal to the gap distance DH1. The second gap distance DG2 is substantially equal to the first gap distance DG1. The gap distance DH1 is substantially equal to the first gap distance DG1.

Figure 1:
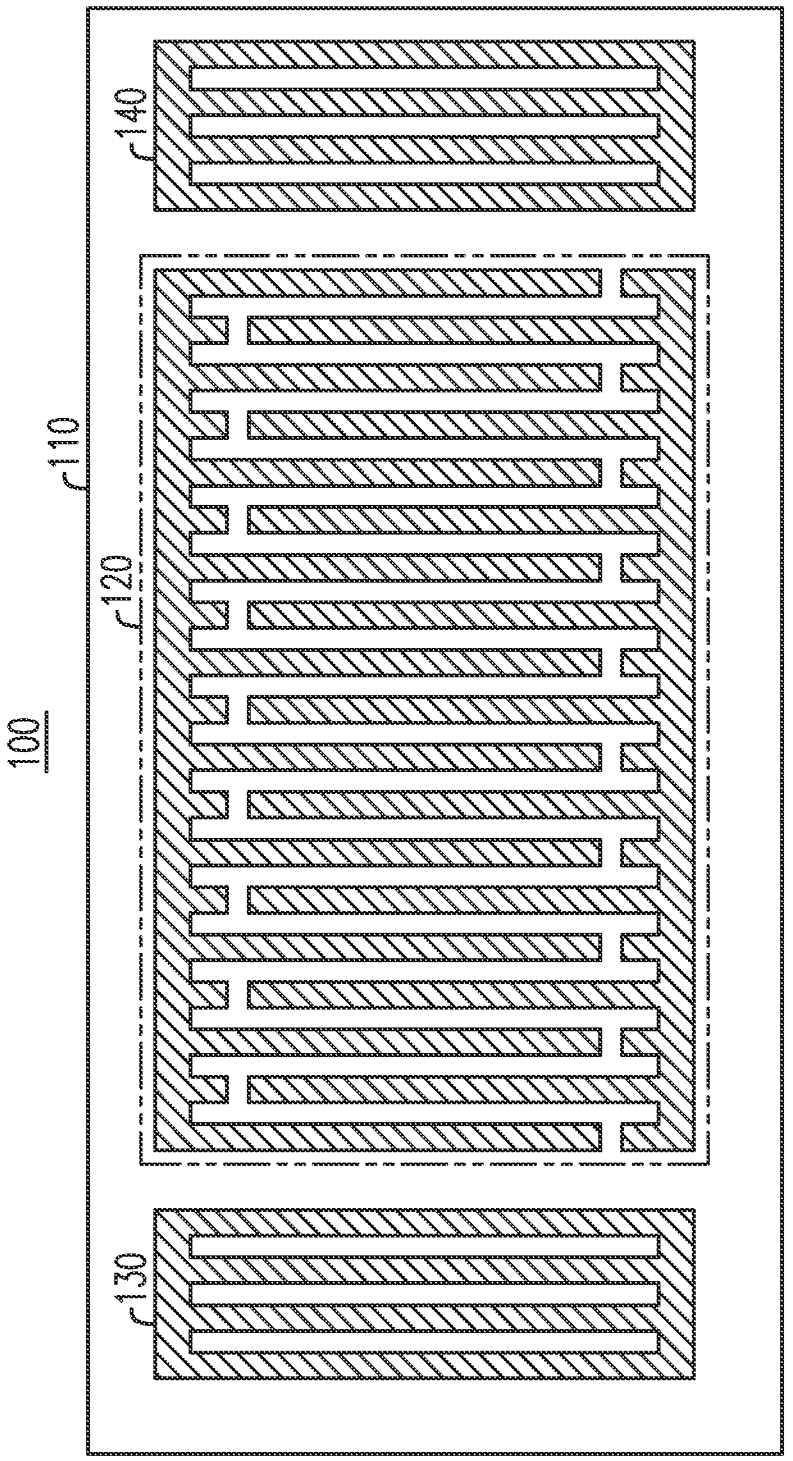
Fig. 1 (Prior art)
FIG. 1 is a schematic diagram showing a SAW resonator in the prior art.
Figure 2:
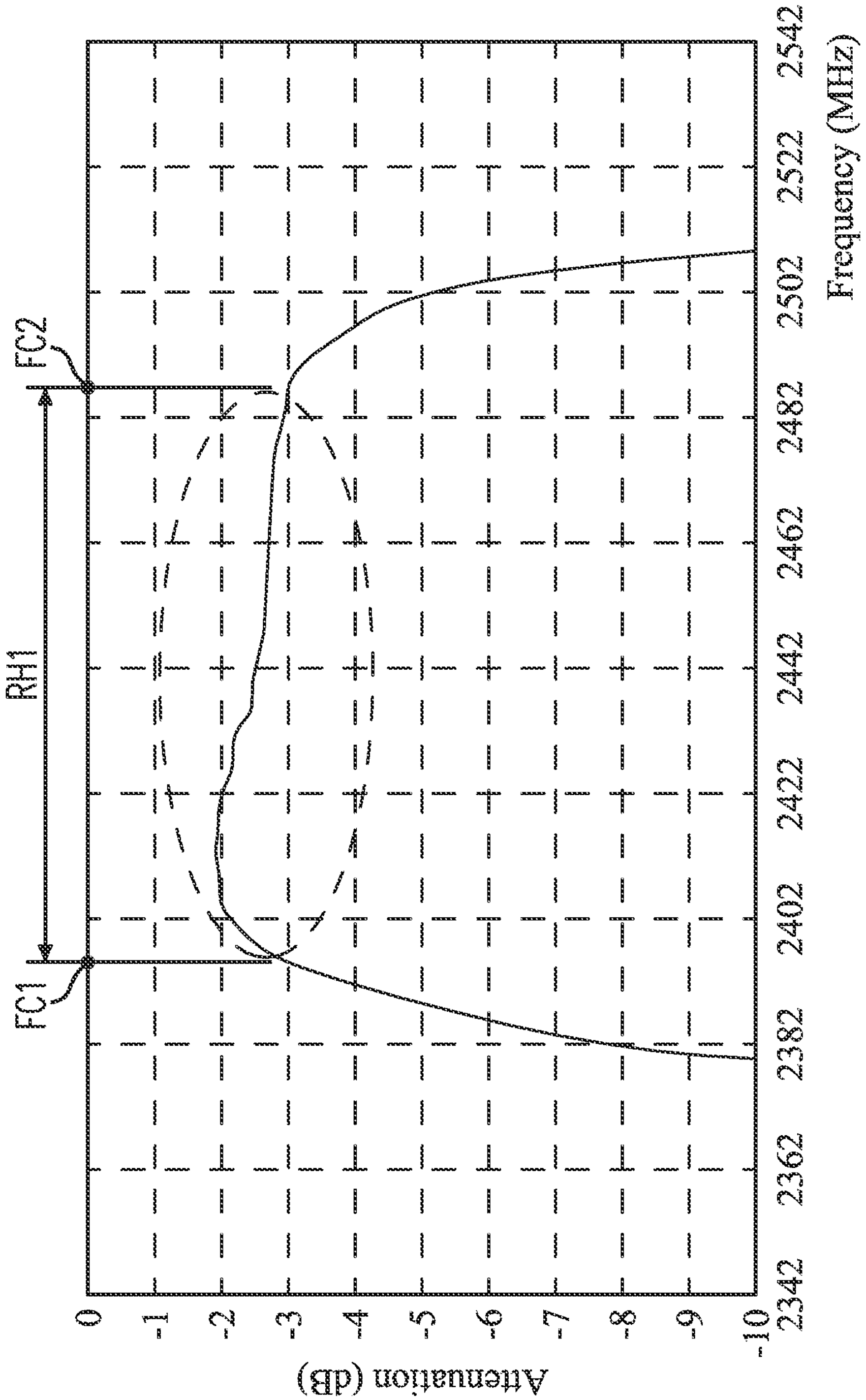
Fig. 2 (Prior art)
FIG. 2 is a schematic diagram showing a signal power of the SAW resonator shown in FIG. 1.

As shown in FIG. 1, a plurality of dummy electrodes and a plurality of practical electrodes have a specific gap distance therebetween. It is suitable that the specific gap distance is less than 0.125λ. The specific gap distance is set to be equal to 0.4 μm because of the limitation of the manufacturing process, and thereby causes that the product property cannot be optimized. For example, the first plurality of practical electrodes 451, 452, . . . are arranged based on a first interlacing overlap length. The second plurality of practical electrodes 471, 472, . . . are arranged based on a second interlacing overlap length. The second interlacing overlap length is configured to be equal to the first interlacing overlap length to cause the data transmission to optimize. The SAW resonator 301 is used to form a surface acoustic wave in the SAW propagation direction. The surface acoustic wave has a propagation speed, a wave frequency and a wavelength. The propagation speed is equal to a product of the wave frequency and the wavelength. For example, the periodic electrode distance λ is equal to the wavelength.

In some embodiments, the first bus bar 520 includes a bar terminal segment 52A and a bar terminal segment 52B being opposite to the bar terminal segment 52A. The first conductive bar 540 includes a bar terminal segment 54A and a bar terminal segment 54B being opposite to the bar terminal segment 54A. The first plurality of dummy electrodes 611, 612, . . . include a dummy electrode 610 directly extending from the bar terminal segment 52A, and a dummy electrode 619 directly extending from the bar terminal segment 52B. The first plurality of conductive connection segments 631, 632, . . . include a first specific connection segment 630 and a second specific connection segment being adjacent to the first specific connection segment 630. Each of the first specific connection segment 630 and the second specific connection segment is directly electrically connected to the bar terminal segment 52A, and is directly electrically connected to the bar terminal segment 54A. At least one of the bar terminal segment 52A, the dummy electrode 610, the first specific connection segment 630, the second specific connection segment and the bar terminal segment 54A is used to cause the first conductive grid 500 to form a closed gap 640 between the bar terminal segment 52A and the bar terminal segment 54A.

The first plurality of conductive connection segments 631, 632, . . . further include a third specific connection segment 639 and a fourth specific connection segment being adjacent to the third specific connection segment 639. Each of the third specific connection segment 639 and the fourth specific connection segment is directly electrically connected to the bar terminal segment 52B, and is directly electrically connected to the bar terminal segment 54B. At least one of the bar terminal segment 52B, the dummy electrode 619, the third specific connection segment 639, the fourth specific connection segment and the bar terminal segment 54B is used to cause the first conductive grid 500 to form a closed gap 649 between the bar terminal segment 52B and the bar terminal segment 54B. For example, the closed gap 640 and the closed gap 649 are respectively two U-shaped gaps.

In some embodiments, the second bus bar 720 includes a bar terminal segment 72A and a bar terminal segment 72B being opposite to the bar terminal segment 72A. The second conductive bar 740 includes a bar terminal segment 74A and a bar terminal segment 74B being opposite to the bar terminal segment 74A. The second plurality of dummy electrodes 811, 812, . . . include a dummy electrode 810 directly extending from the bar terminal segment 72A, and a dummy electrode 819 directly extending from the bar terminal segment 72. The second plurality of conductive connection segments 831, 832, . . . include a fifth specific connection segment 830. The fifth specific connection segment 830 is directly electrically connected to the bar terminal segment 72A and the bar terminal segment 74A. At least one of the bar terminal segment 72A, the dummy electrode 810, the fifth specific connection segment 830 and the bar terminal segment 74A is used to cause the second conductive grid 700 to form an open gap 840 between the bar terminal segment 72A and the bar terminal segment 74A.

The second plurality of conductive connection segments 831, 832, . . . further include a sixth specific connection segment 839. The sixth specific connection segment 839 is directly electrically connected to the bar terminal segment 72B and the bar terminal segment 74B. At least one of the bar terminal segment 72B, the dummy electrode 819, the sixth specific connection segment 839 and the bar terminal segment 74B is used to cause the second conductive grid 700 to form an open gap 849 between the bar terminal segment 72B and the bar terminal segment 74B. For example, the open gap 840 and the open gap 849 are respectively two L-shaped gaps. For example, the first conductive grid 500 and the first plurality of practical electrodes 451, 452, . . . are formed in one piece, and have the same material. The second conductive grid 700 and the second plurality of practical electrodes 471, 472, . . . are formed in one piece, and have the same material.

Figure 7:
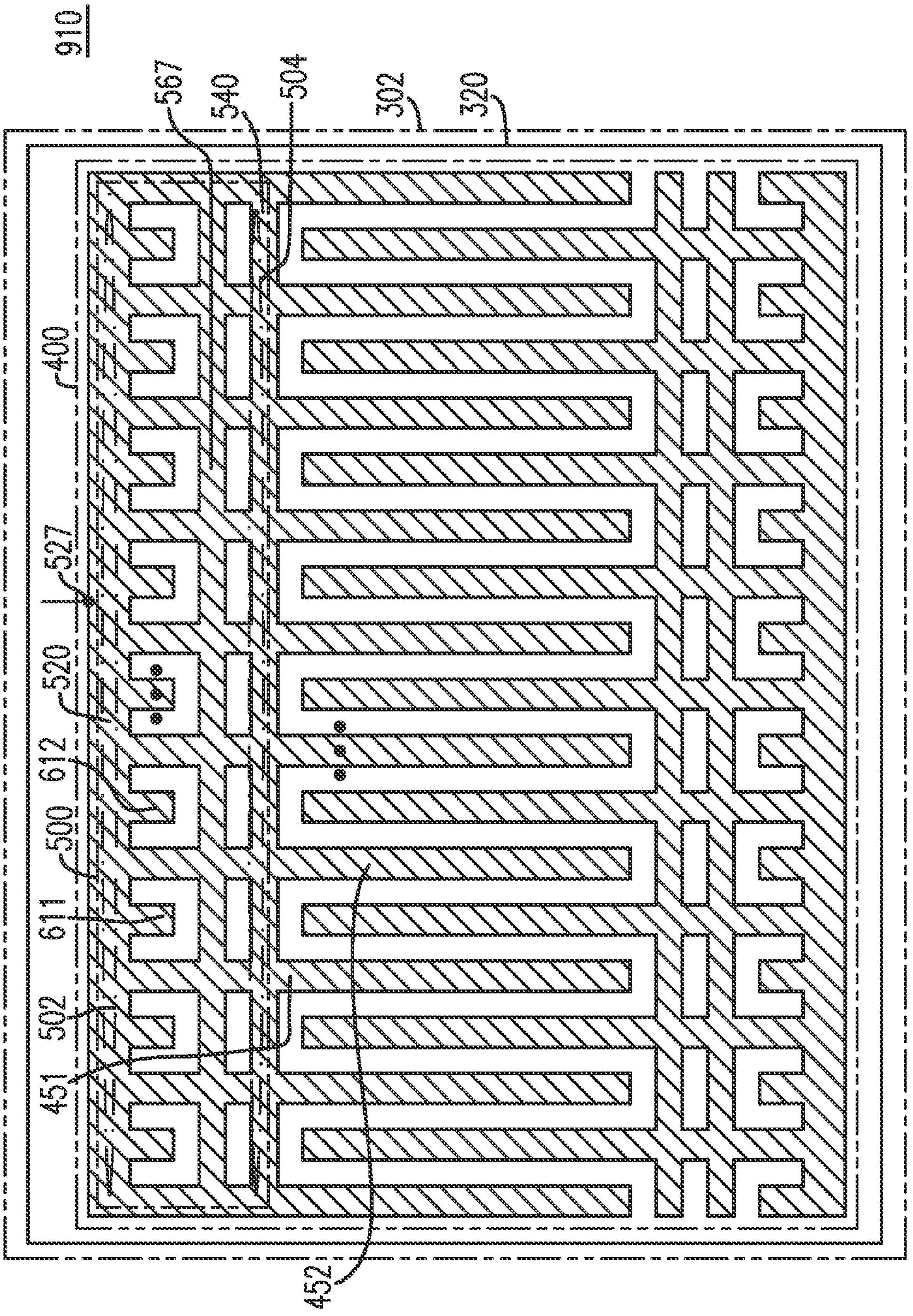
FIG. 7 is a schematic diagram showing a signal processing system according to various embodiments of the present disclosure.

Please refer to FIG. 7, which is a schematic diagram showing a signal processing system 910 according to various embodiments of the present disclosure. As shown in FIG. 7, the signal processing system 910 includes a surface-acoustic-wave (SAW) resonator 302. The SAW resonator 302 includes an interdigital transducer 400. The interdigital transducer 400 is disposed on a piezoelectric substrate 320, and includes a first conductive grid 500 and a first plurality of practical electrodes 451, 452, . . . .

The first conductive grid 500 includes a first bus bar 520 disposed on a first side 502 of the first conductive grid 500, a first plurality of dummy electrodes 611, 612, . . . directly extending from the first bus bar 520, a first conductive bar 540 disposed on a second side 504 of the first conductive grid 500, and a first inner bar 567 disposed between the first bus bar 520 and the first conductive bar 540. The first bus bar 520 has a first signal transmission terminal 527. The first conductive bar 540 is opposite to the first bus bar 520; or the first conductive bar 540 is disposed on the second side 504 and is opposite to the first bus bar 520. Each of the first plurality of practical electrodes 451, 452, . . . extends from the first conductive bar 540.

Figure 8:
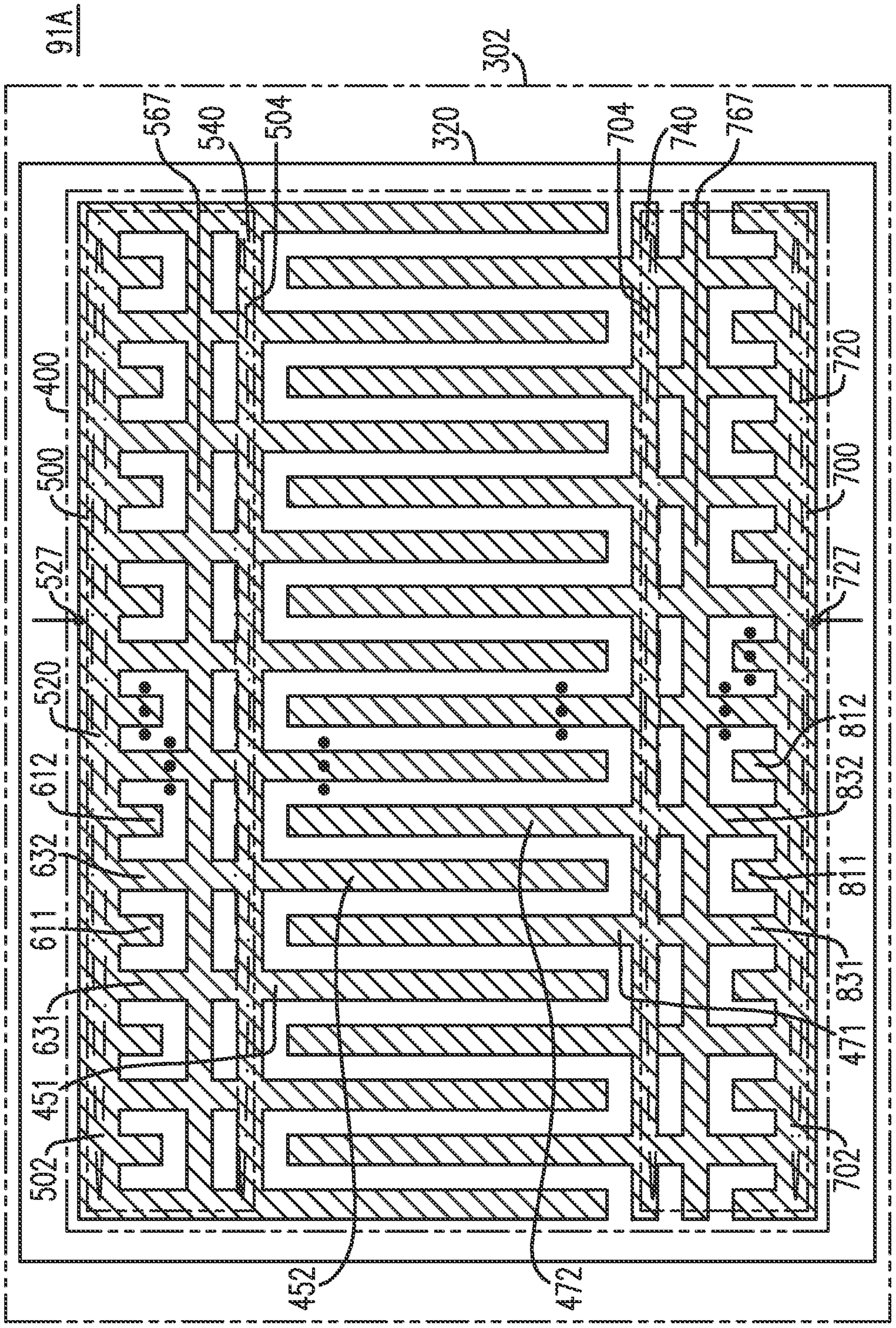
FIG. 8 is a schematic diagram showing an implementation structure of the signal processing system shown in FIG. 7.
Figure 9:
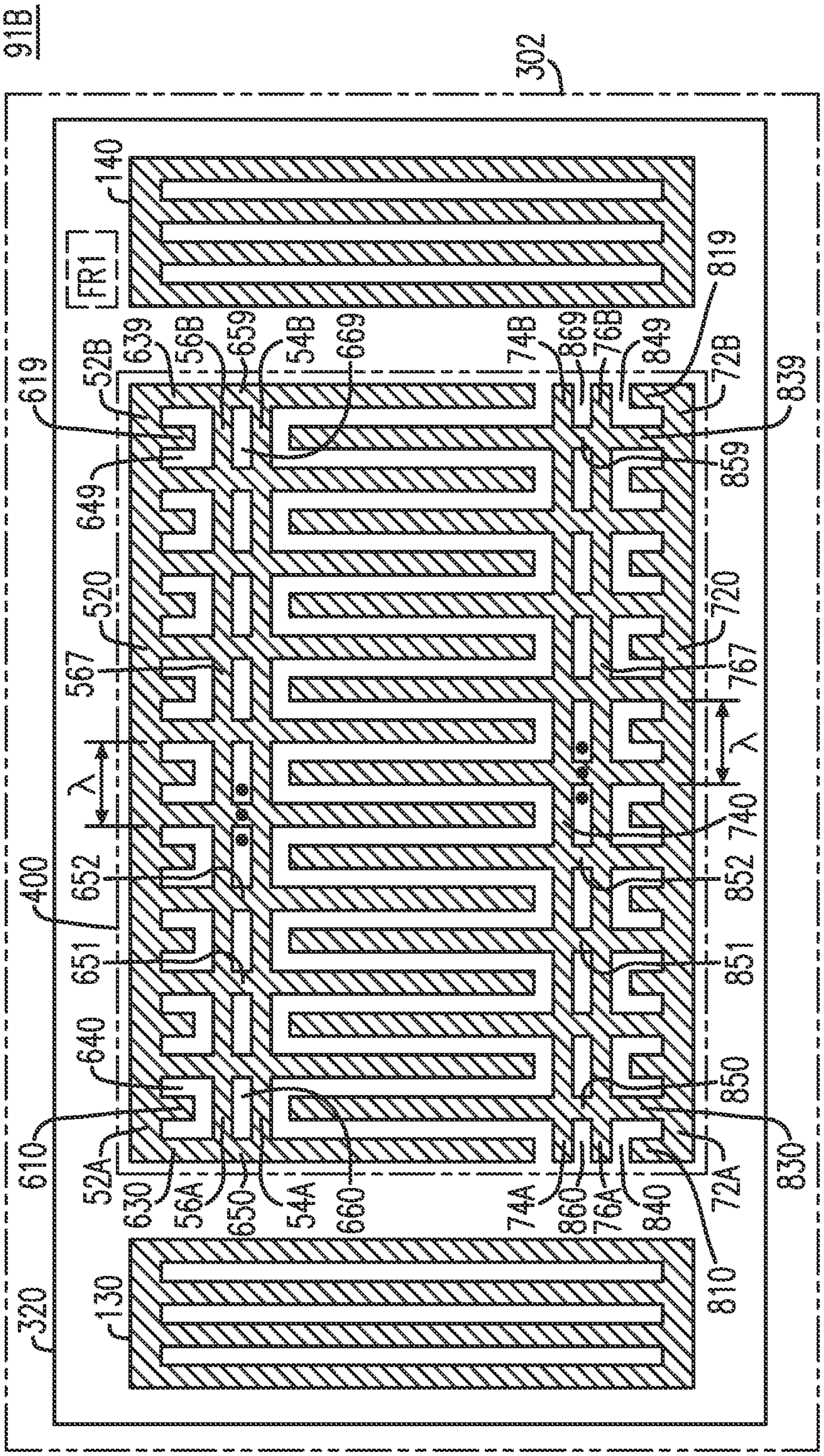
FIG. 9 is a schematic diagram showing an implementation structure of the signal processing system shown in FIG. 7.
Figure 10:
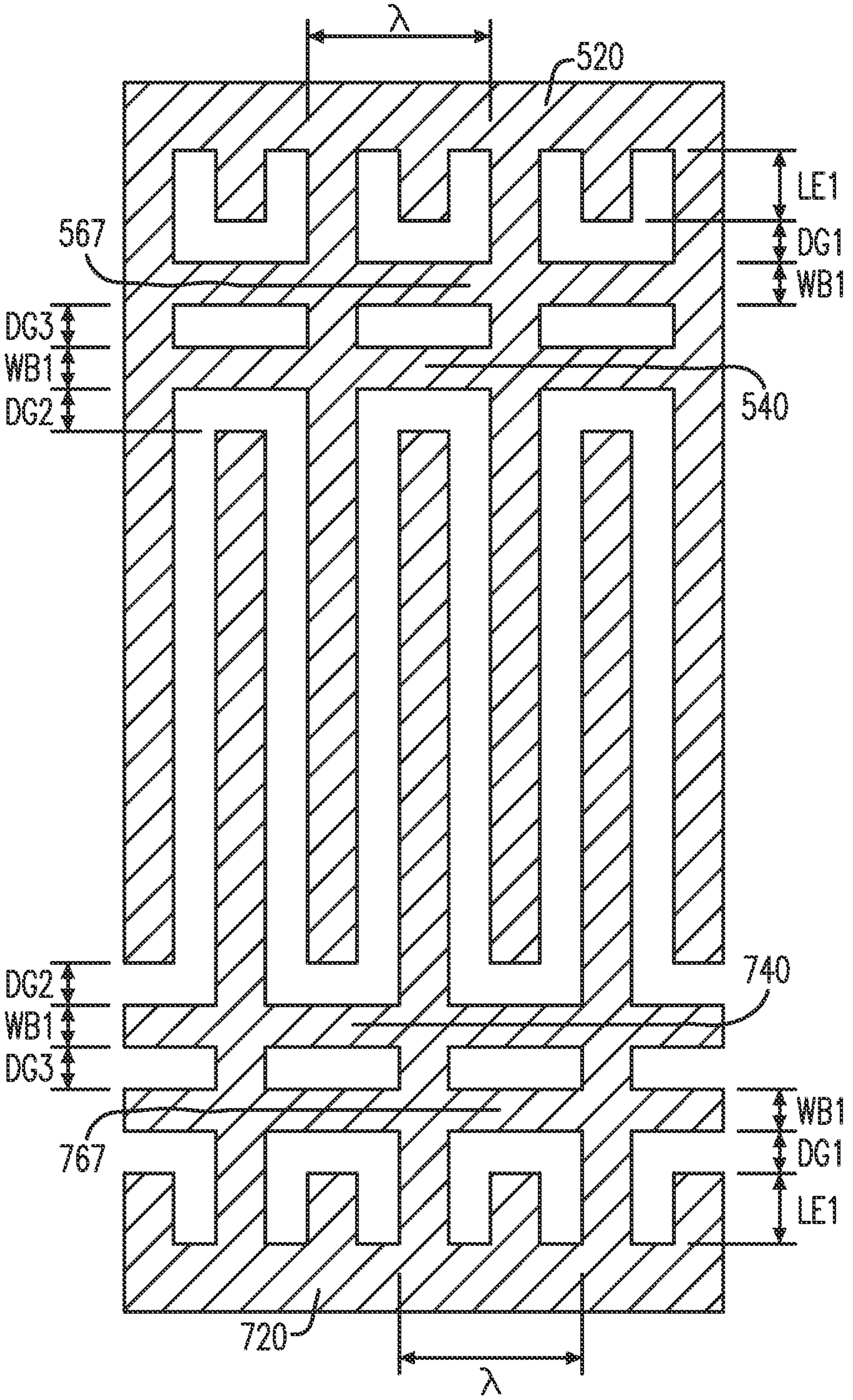
FIG. 10 is a schematic diagram showing a partial structure of an interdigital transducer shown in FIG. 7.

Please refer to FIG. 8, FIG. 9 and FIG. 10. FIG. 8 is a schematic diagram showing an implementation structure 91A of the signal processing system 910 shown in FIG. 7. FIG. 9 is a schematic diagram showing an implementation structure 91B of the signal processing system 910 shown in FIG. 7. FIG. 10 is a schematic diagram showing a partial structure of the interdigital transducer 400 shown in FIG. 7. As shown in FIG. 8 and FIG. 9, each of the implementation structure 91A and the implementation structure 91B includes the SAW resonator 302.

In some embodiments, the first inner bar 567 and the first conductive bar 540 are both substantially parallel with the first bus bar 520. The first conductive grid 500 further includes a first plurality of conductive connection segments 631, 632, . . . . The first plurality of conductive connection segments 631, 632, . . . are disposed between the first bus bar 520 and the first inner bar 567, are aligned with the first plurality of practical electrodes 451, 452, . . . respectively, and are interlaced with the first plurality of dummy electrodes 611, 612, . . . . For example, the first plurality of conductive connection segments 631, 632, . . . are electrically connected to the first bus bar 520 and the first inner bar 567, and directly extend between the first bus bar 520 and the first inner bar 567.

The interdigital transducer 400 further includes a second conductive grid 700 and a second plurality of practical electrodes 471, 472, . . . . The second conductive grid 700 is opposite to the first conductive grid 500, and includes a second bus bar 720 disposed on a first side 702 of the second conductive grid 700, a second plurality of dummy electrodes 811, 812, . . . directly extending from the second bus bar 720, a second conductive bar 740 disposed on a second side 704 of the second conductive grid 700, and a second inner bar 767 disposed between the second bus bar 720 and the second conductive bar 740. The second bus bar 720 has a second signal transmission terminal 727. The second conductive bar 740 is opposite to the second bus bar 720; or the second conductive bar 740 is disposed on the second side 704 and is opposite to the second bus bar 720. For example, the first conductive bar 540, the second conductive bar 740, the first inner bar 567 and the second inner bar 767 are reflecting bars. For example, the first conductive grid 500 and the second conductive grid 700 respectively include a first effective reflecting structure and a second effective reflecting structure. The first effective reflecting structure includes the first conductive bar 540 and the first inner bar 567, and is used to cause the SAW resonator 302 to have desired output power stability in a resonance frequency range. The second effective reflecting structure includes the second conductive bar 740 and the second inner bar 767, and is used to cause the SAW resonator 302 to have desired output power stability in the resonance frequency range.

The second plurality of practical electrodes 471, 472, . . . all extend from the second conductive bar 740, and are interlaced with the first plurality of practical electrodes 451, 452, . . . . The second inner bar 767 and the second conductive bar 740 are both substantially parallel with a second bus bar 720. The first plurality of dummy electrodes 611, 612, . . . are aligned with the second plurality of practical electrodes 471, 472, . . . respectively. The second plurality of dummy electrodes 811, 812, . . . are aligned with the first plurality of practical electrodes 451, 452, . . . respectively.

In some embodiments, the second conductive grid 700 further includes a second plurality of conductive connection segments 831, 832, . . . . The second plurality of conductive connection segments 831, 832, . . . are disposed between the second bus bar 720 and the second inner bar 767, are aligned with the second plurality of practical electrodes 471, 472, . . . respectively, and are interlaced with the second plurality of dummy electrodes 811, 812, . . . . The first plurality of practical electrodes 451, 452, . . . have a periodic electrode distance λ. Each of the first plurality of dummy electrodes 611, 612, . . . and the first inner bar 567 have a first gap distance DG1 therebetween which ranges from 0.0625λ to 0.5λ. The first conductive bar 540 and each of the second plurality of practical electrodes 471, 472, . . . have a second gap distance DG2 therebetween which ranges from 0.0625λ to 0.5λ. For example, the first inner bar 567 and the second inner bar 767 are respectively two conductive inner bars. For example, the second plurality of conductive connection segments 831, 832, . . . are electrically connected to the second bus bar 720 and the second inner bar 767, and directly extend between the second bus bar 720 and the second inner bar 767.

The SAW resonator 302 further has a specific resonance frequency FR1. The specific resonance frequency FR1 ranges from 30 MHz to 6 GHz. Each of the first plurality of dummy electrodes 611, 612, . . . has an electrode length LE1 which ranges from 0.1λ to 5λ. Each of the first conductive bar 540 and the first inner bar 567 has a bar width WB1 which ranges from 0.0625λ to 0.5λ. The first conductive bar 540 and the first inner bar 567 have a third gap distance DG3 therebetween which ranges from 0.0625λ to 0.5λ.

In some embodiments, the SAW resonator 302 includes a substrate 320 and the interdigital transducer 400 disposed on the substrate 320. For example, the substrate 320 is a piezoelectric substrate. The interdigital transducer 400 includes the first conductive grid 500 and the first plurality of practical electrodes 451, 452, . . . .

In some embodiments, each of the second plurality of dummy electrodes 811, 812, . . . and the second inner bar 767 have the first gap distance DG1 therebetween. The second conductive bar 740 and each of the first plurality of practical electrodes 451, 452, . . . have the second gap distance DG2 therebetween. Each of the second conductive bar 740 and the second inner bar 767 has the bar width WB1. The second conductive bar 740 and the second inner bar 767 have the third gap distance DG3 therebetween. The first plurality of practical electrodes 451, 452, . . . are mutually interlaced with the second plurality of practical electrodes 471, 472, . . . to form a plurality of interdigital electrode fingers.

The SAW resonator 302 has a SAW propagation direction. The first conductive bar 540 has a first longitudinal direction. The first longitudinal direction is substantially parallel with the SAW propagation direction. The second conductive bar 740 has a second longitudinal direction. The second longitudinal direction is substantially parallel with the SAW propagation direction. The first inner bar 567 and the second inner bar 767 respectively have a third longitudinal direction and a fourth longitudinal direction. Each of the third longitudinal direction and the fourth longitudinal direction is substantially parallel with the SAW propagation direction.

In some embodiments, the first plurality of practical electrodes 451, 452, . . . extend from the first conductive bar 540 in a first extension direction. The first extension direction is substantially perpendicular to the SAW propagation direction. The second plurality of practical electrodes 471, 472, . . . extend from the second conductive bar 740 in a second extension direction. The second extension direction is substantially perpendicular to the SAW propagation direction. The interdigital transducer 400 has a first outer side in the SAW propagation direction and a second outer side being opposite to the first outer side. The SAW resonator 302 further includes a reflector 130 disposed on the first outer side and a reflector 140 disposed on the second outer side. For example, the reflector 140 is opposite to the reflector 130, and matches the reflector 130.

The first plurality of dummy electrodes 611, 612, . . . directly extend from the first bus bar 520 in a third extension direction. The second plurality of dummy electrodes 811, 812, . . . directly extend from the second bus bar 720 in a fourth extension direction. Each of the third extension direction and the fourth extension direction is substantially perpendicular to the SAW propagation direction. For example, the first plurality of practical electrodes 451, 452, . . . is arranged based on a first interlacing overlap length. The second plurality of practical electrodes 471, 472, . . . is arranged based on a second interlacing overlap length. The second interlacing overlap length is configured to be equal to the first interlacing overlap length to cause the data transmission to optimize.

The first conductive grid 500 further includes a plurality of conductive connection segments 651, 652, . . . . The plurality of conductive connection segments 651, 652, . . . are disposed between the first conductive bar 540 and the first inner bar 567, and are aligned with the first plurality of practical electrodes 451, 452, . . . respectively. For example, the plurality of conductive connection segments 651, 652, . . . are electrically connected to the first conductive bar 540 and the first inner bar 567, and directly extend between the first conductive bar 540 and the first inner bar 567. The second conductive grid 700 further includes a plurality of conductive connection segments 851, 852, . . . . The plurality of conductive connection segments 851, 852, . . . are disposed between the second conductive bar 740 and the second inner bar 767, and are aligned with the second plurality of practical electrodes 471, 472, . . . respectively. For example, the plurality of conductive connection segments 851, 852, . . . are electrically connected to the second conductive bar 740 and the second inner bar 767, directly extend between the second conductive bar 740 and the second inner bar 767.

In some embodiments, the first bus bar 520 includes a bar terminal segment 52A and a bar terminal segment 52B being opposite to the bar terminal segment 52A. The first inner bar 567 includes a bar terminal segment 56A and a bar terminal segment 56B being opposite to the bar terminal segment 56A. The first plurality of dummy electrodes 611, 612, . . . include a dummy electrode 610 directly extending from the bar terminal segment 52A, and a dummy electrode 619 directly extending from the bar terminal segment 52B. The first plurality of conductive connection segments 631, 632, . . . include a first specific connection segment 630 and a second specific connection segment being adjacent to the first specific connection segment 630. Each of the first specific connection segment 630 and the second specific connection segment is directly electrically connected to the bar terminal segment 52A, and is directly electrically connected to the bar terminal segment 56A. At least one of the bar terminal segment 52A, the dummy electrode 610, the first specific connection segment 630, the second specific connection segment and the bar terminal segment 56A is used to cause the first conductive grid 500 to form a closed gap 640 between the bar terminal segment 52A and the bar terminal segment 56A.

The first plurality of conductive connection segments 631, 632, . . . further include a third specific connection segment 639 and a fourth specific connection segment being adjacent to the third specific connection segment 639. Each of the third specific connection segment 639 and the fourth specific connection segment is directly electrically connected to the bar terminal segment 52B, and is directly electrically connected to the bar terminal segment 56B. At least one of the bar terminal segment 52B, the dummy electrode 619, the third specific connection segment 639, the fourth specific connection segment and the bar terminal segment 56B is used to cause the first conductive grid 500 to form a closed gap 649 between the bar terminal segment 52B and the bar terminal segment 56B. For example, the closed gap 640 and the closed gap 649 are respectively two U-shaped gaps.

In some embodiments, the second bus bar 720 includes a bar terminal segment 72A and a bar terminal segment 72B being opposite to the bar terminal segment 72A. The second inner bar 767 includes a bar terminal segment 76A and a bar terminal segment 76B being opposite to the bar terminal segment 76A. The second plurality of dummy electrodes 811, 812, . . . include a dummy electrode 810 directly extending from the bar terminal segment 72A, and a dummy electrode 819 directly extending from the bar terminal segment 72B. The second plurality of conductive connection segments 831, 832, . . . include a fifth specific connection segment 830. The fifth specific connection segment 830 is directly electrically connected to the bar terminal segment 72A and the bar terminal segment 76A. At least one of the bar terminal segment 72A, the dummy electrode 810, the fifth specific connection segment 830 and the bar terminal segment 76A is used to cause the second conductive grid 700 to form an open gap 840 between the bar terminal segment 72A and the bar terminal segment 76A.

The second plurality of conductive connection segments 831, 832, . . . further include a sixth specific connection segment 839. The sixth specific connection segment 839 is directly electrically connected to the bar terminal segment 72B and the bar terminal segment 76B. At least one of the bar terminal segment 72B, the dummy electrode 819, the sixth specific connection segment 839 and the bar terminal segment 76B is used to cause the second conductive grid 700 to form an open gap 849 between the bar terminal segment 72B and the bar terminal segment 76B. For example, the open gap 840 and the open gap 849 are respectively two L-shaped gaps. For example, the first conductive grid 500 and the first plurality of practical electrodes 451, 452, . . . are formed in one piece, and have the same material. The second conductive grid 700 and the second plurality of practical electrodes 471, 472, . . . are formed in one piece, and have the same material.

In some embodiments, the first conductive bar 540 includes a bar terminal segment 54A and a bar terminal segment 54B being opposite to the bar terminal segment 54A. The plurality of conductive connection segments 651, 652, . . . include a first specific connection segment 650 and a second specific connection segment being adjacent to the first specific connection segment 650. Each of the first specific connection segment 650 and the second specific connection segment is directly electrically connected to the bar terminal segment 54A, and is directly electrically connected to the bar terminal segment 56A. At least one of the bar terminal segment 54A, the first specific connection segment 650, the second specific connection segment and the bar terminal segment 56A is used to cause the first conductive grid 500 to form a closed gap 660 between the bar terminal segment 54A and the bar terminal segment 56A.

The plurality of conductive connection segments 651, 652, . . . further include a third specific connection segment 659 and a fourth specific connection segment being adjacent to the third specific connection segment 659. Each of the third specific connection segment 659 and the fourth specific connection segment is directly electrically connected to the bar terminal segment 54B, and is directly electrically connected to the bar terminal segment 56B. At least one of the bar terminal segment 54B, the third specific connection segment 659, the fourth specific connection segment and the bar terminal segment 56B is used to cause the first conductive grid 500 to form a closed gap 669 between the bar terminal segment 54B and the bar terminal segment 56B.

In some embodiments, the second conductive bar 740 includes a bar terminal segment 74A and a bar terminal segment 74B being opposite to the bar terminal segment 74A. The plurality of conductive connection segments 851, 852, . . . include a fifth specific connection segment 850. The fifth specific connection segment 850 is directly electrically connected to the bar terminal segment 74A and the bar terminal segment 76A. At least one of the bar terminal segment 74A, the fifth specific connection segment 850 and the bar terminal segment 76A is used to cause the second conductive grid 700 to form an open gap 860 between the bar terminal segment 74A and the bar terminal segment 76A.

The plurality of conductive connection segments 851, 852, . . . further include a sixth specific connection segment 859. The sixth specific connection segment 859 is directly electrically connected to the bar terminal segment 74B and the bar terminal segment 76B. At least one of the bar terminal segment 74B, the sixth specific connection segment 859 and the bar terminal segment 76B is used to cause the second conductive grid 700 to form an open gap 869 between the bar terminal segment 74B and the bar terminal segment 76B.

Figure 11:
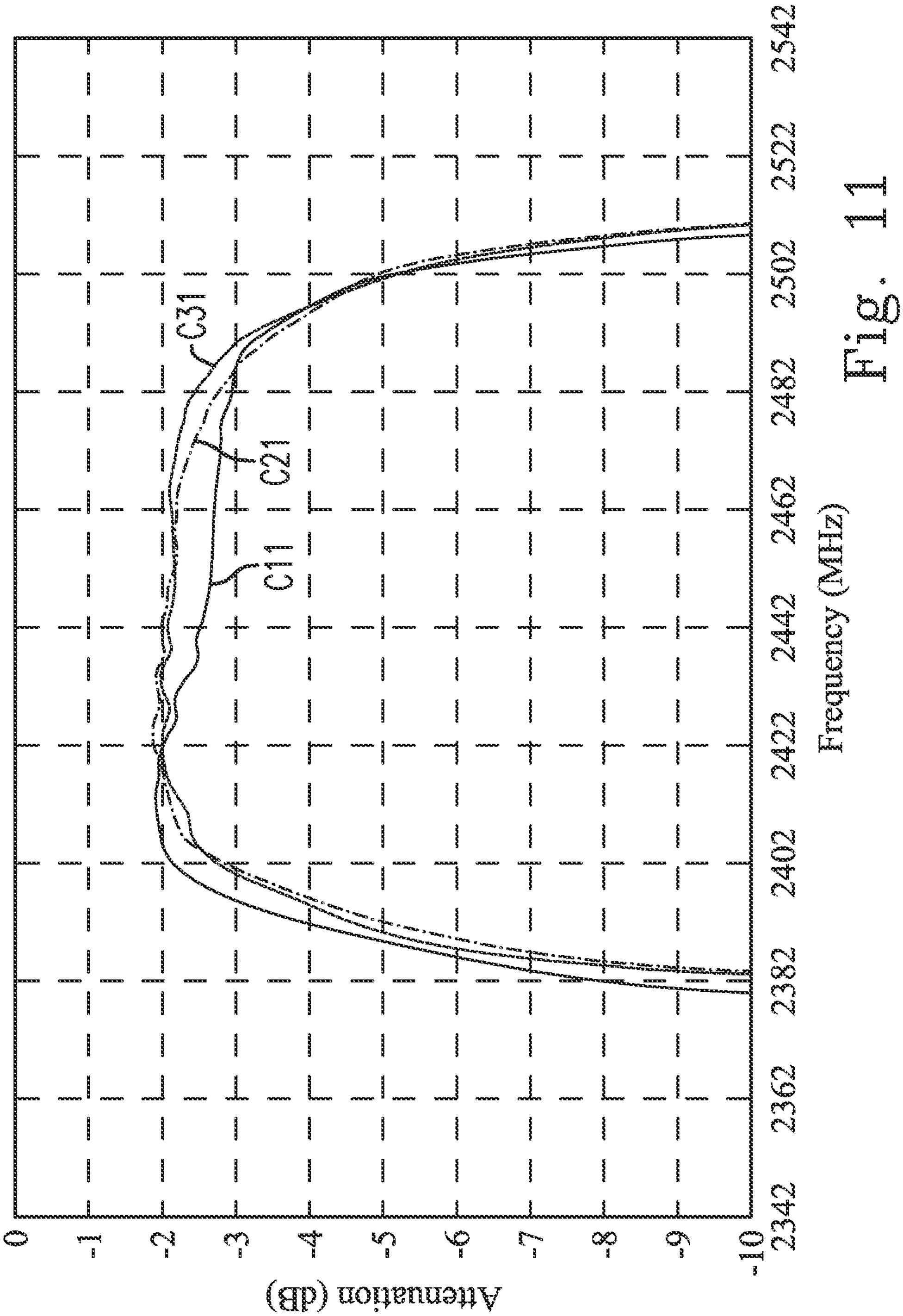
FIG. 11 is a schematic diagram showing signal powers of SAW resonators shown in FIGS. 1, 3 and 7 according to a first specific situation.

Please refer to FIG. 11. FIG. 11 is a schematic diagram showing signal powers of the SAW resonators 100, 301 and 302 shown in FIGS. 1, 3 and 7 according to a first specific situation. FIG. 11 shows a filtering property curve C11, a filtering property curve C21 and a filtering property curve C31. The filtering property curve C11 is used to represent a band-pass filtering property of the SAW resonator 100 shown in FIG. 1. The filtering property curve C21 is used to represent a band-pass filtering property of the SAW resonator 301 shown in FIG. 3. The filtering property curve C31 is used to represent a band-pass filtering property of the SAW resonator 302 shown in FIG. 7.

As shown in FIG. 11, according to the filtering property curve C11, an insertion loss of the SAW resonator 100 is equal to 3.0 dB, and a pass-band ripple of the SAW resonator 100 is equal to 1.2 dB. According to the filtering property curve C21, an insertion loss of the SAW resonator 301 is equal to 2.5 dB, and a pass-band ripple of the SAW resonator 301 is equal to 0.8 dB. According to the filtering property curve C31, an insertion loss of the SAW resonator 302 is equal to 2.2 dB, and a pass-band ripple of the SAW resonator 302 is equal to 0.3 dB. According to the filtering property curves C11, C21 and C31, any of the SAW resonator 301 and the SAW resonator 302 is used to obtain a high quality factor value (Q value) and a low insertion loss, and is used to optimize the band-pass amplitude.

Figure 12:
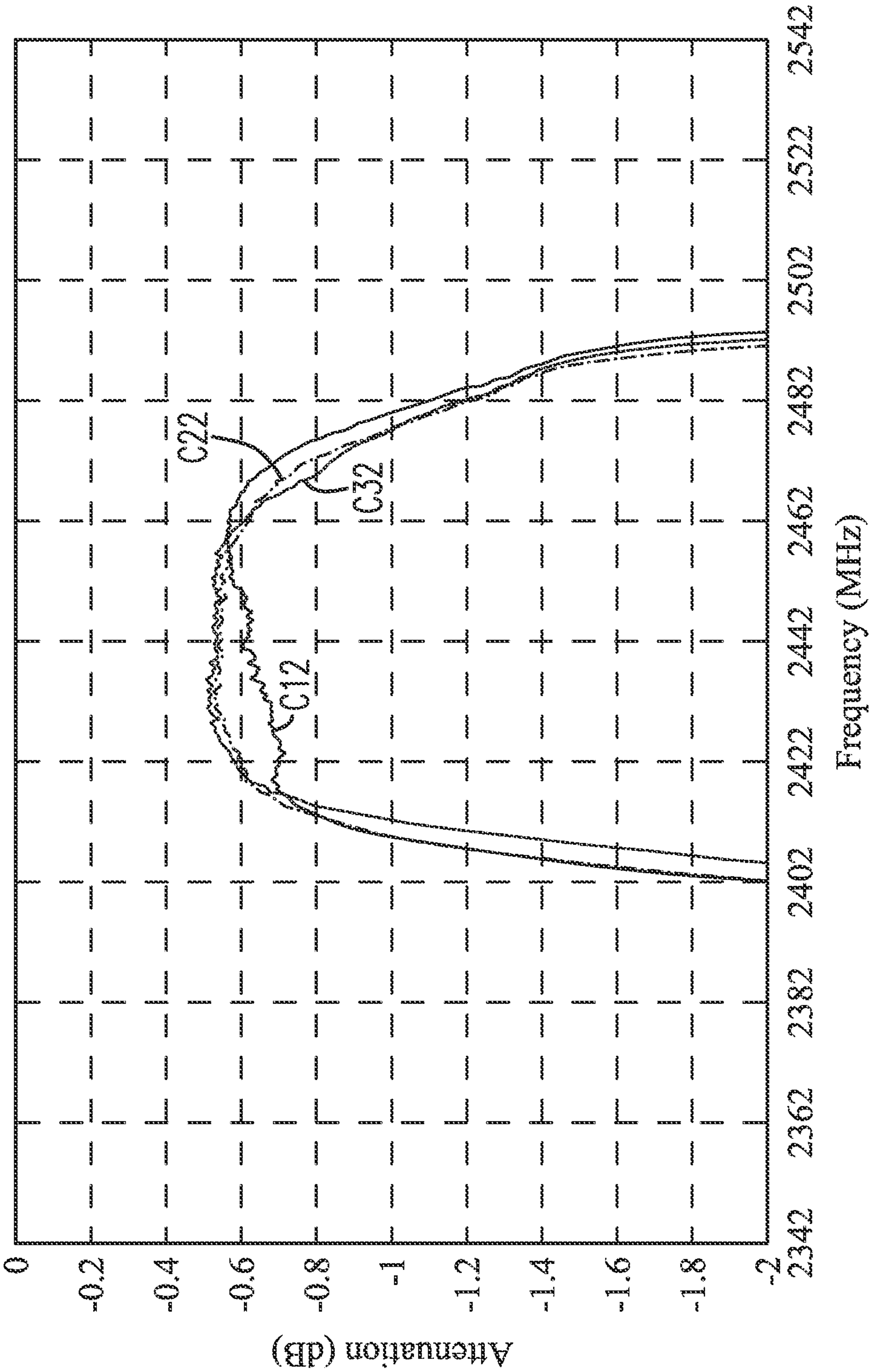
FIG. 12 is a schematic diagram showing signal powers of the SAW resonators shown in FIGS. 1, 3 and 7 according to a second specific situation.

Please refer to FIG. 12. FIG. 12 is a schematic diagram showing signal powers of the SAW resonators 100, 301 and 302 shown in FIGS. 1, 3 and 7 according to a second specific situation. FIG. 12 shows a filtering property curve C12, a filtering property curve C22 and a filtering property curve C32. The filtering property curve C12 is used to represent a band-pass filtering property of the SAW resonator 100 shown in FIG. 1. The filtering property curve C22 is used to represent a band-pass filtering property of the SAW resonator 301 shown in FIG. 3. The filtering property curve C32 is used to represent a band-pass filtering property of the SAW resonator 302 shown in FIG. 7.

As shown in FIG. 12, according to the filtering property curve C12, an insertion loss of the SAW resonator 100 is equal to 0.65 dB, and a pass-band ripple of the SAW resonator 100 is equal to 0.13 dB. According to the filtering property curve C22, an insertion loss of the SAW resonator 301 is equal to 0.53 dB, and a pass-band ripple of the SAW resonator 301 is equal to 0.038 dB. According to the filtering property curve C32, an insertion loss of the SAW resonator 302 is equal to 0.5 dB, and a pass-band ripple of the SAW resonator 302 is equal to 0.03 dB. According to the filtering property curves C12, C22 and C32, any of the SAW resonator 301 and the SAW resonator 302 is used to obtain a high quality factor value (Q value) and a low insertion loss, and is used to optimize the band-pass amplitude.

Figure 13:
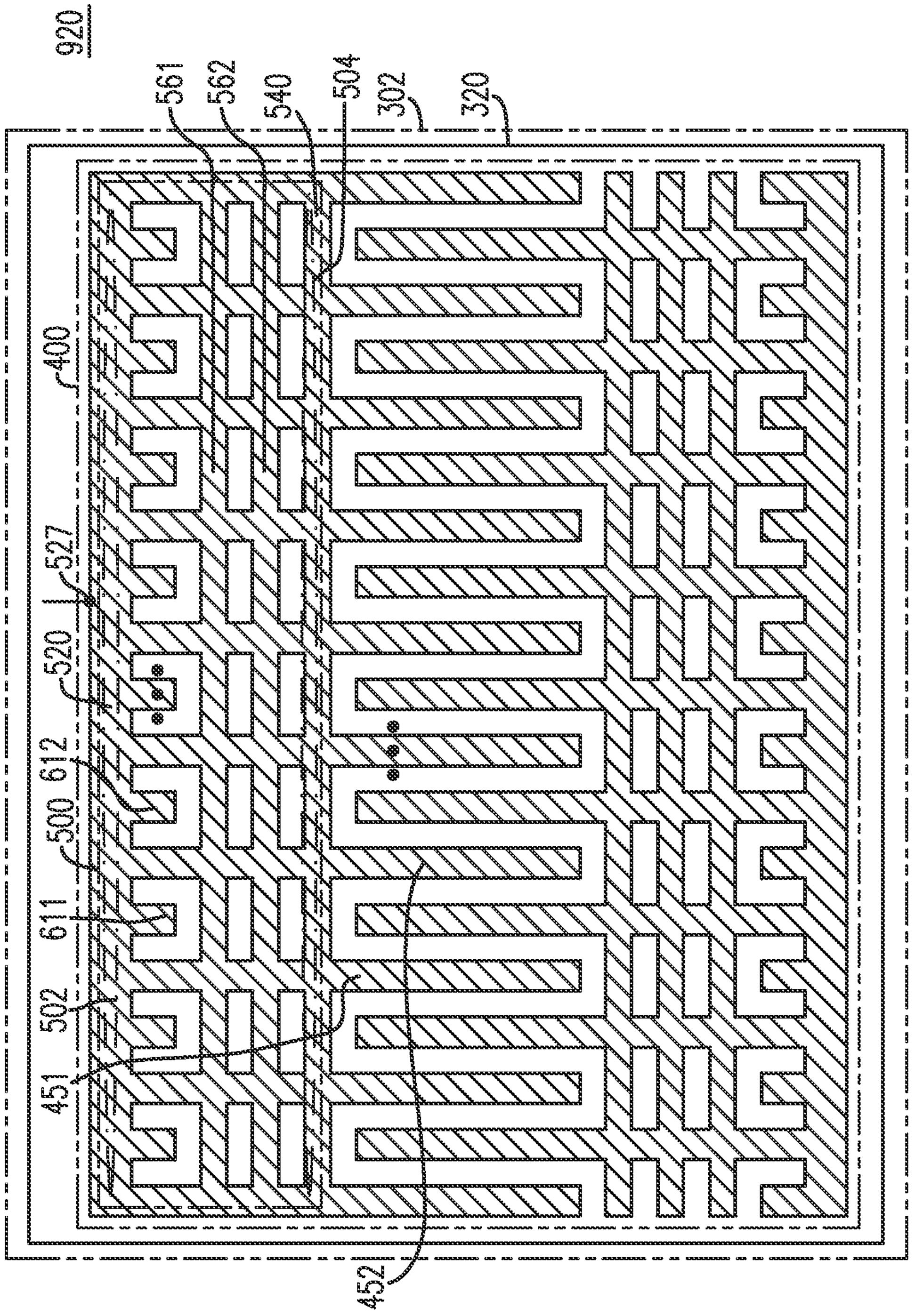
FIG. 13 is a schematic diagram showing a signal processing system according to various embodiments of the present disclosure.

Please refer to FIG. 13, which is a schematic diagram showing a signal processing system 920 according to various embodiments of the present disclosure. As shown in FIG. 13, the signal processing system 920 includes a surface-acoustic-wave (SAW) resonator 303. The SAW resonator 303 includes an interdigital transducer 400. The interdigital transducer 400 is disposed on a piezoelectric substrate 320, and includes a first conductive grid 500 and a first plurality of practical electrodes 451, 452, . . . .

The first conductive grid 500 includes a first bus bar 520 disposed on a first side 502 of the first conductive grid 500, a first plurality of dummy electrodes 611, 612, . . . directly extending from the first bus bar 520, a first conductive bar 540 disposed on a second side 504 of the first conductive grid 500, and a first plurality of inner bars 561, 562, . . . (or 561 and 562) disposed between the first bus bar 520 and the first conductive bar 540. The first bus bar 520 has a first signal transmission terminal 527. The first conductive bar 540 is opposite to the first bus bar 520; or the first conductive bar 540 is disposed on the second side 504 and is opposite to the first bus bar 520. Each of the first plurality of practical electrodes 451, 452, . . . extends from the first conductive bar 540.

Figure 14:
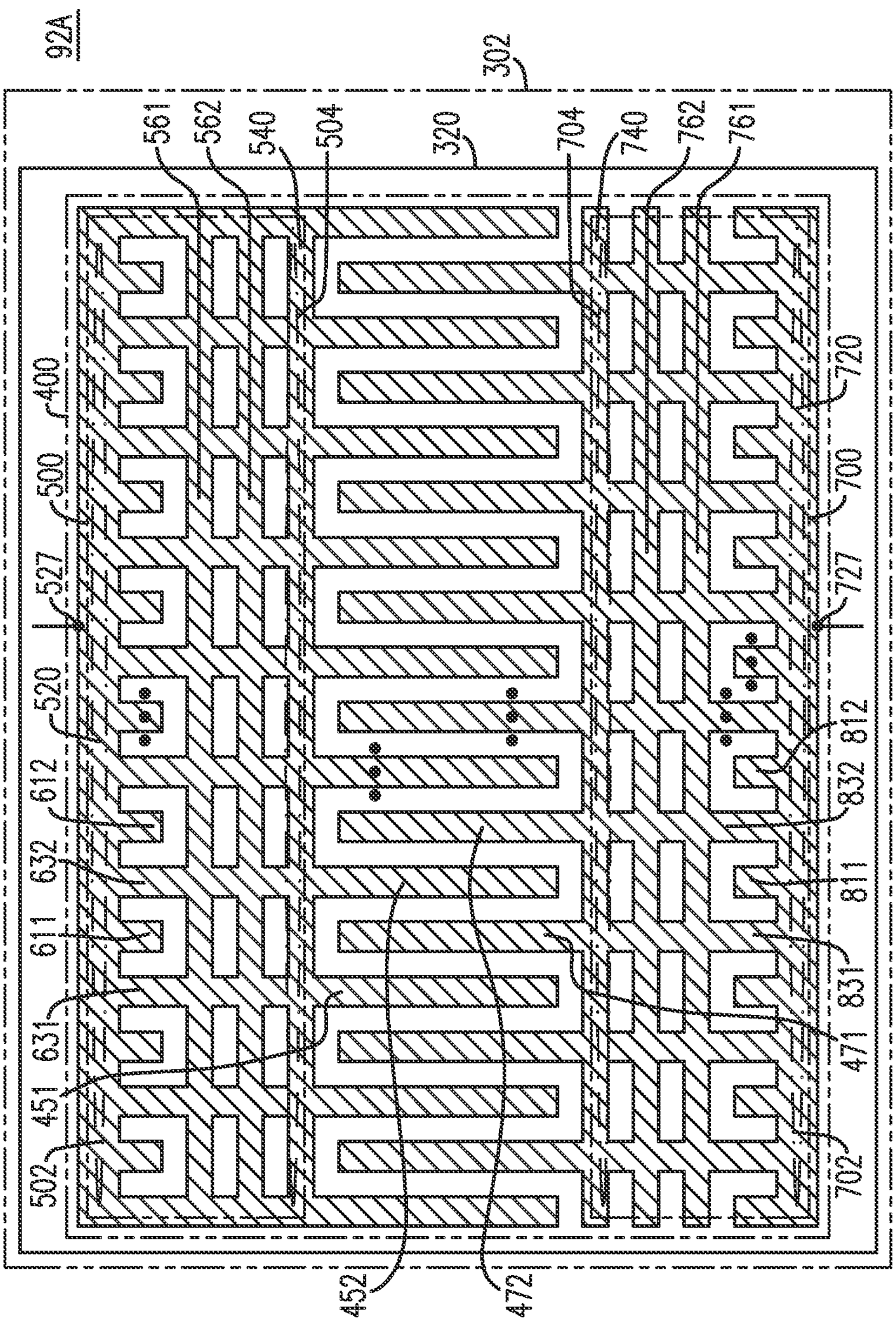
FIG. 14 is a schematic diagram showing an implementation structure of the signal processing system shown in FIG. 13.
Figure 15:
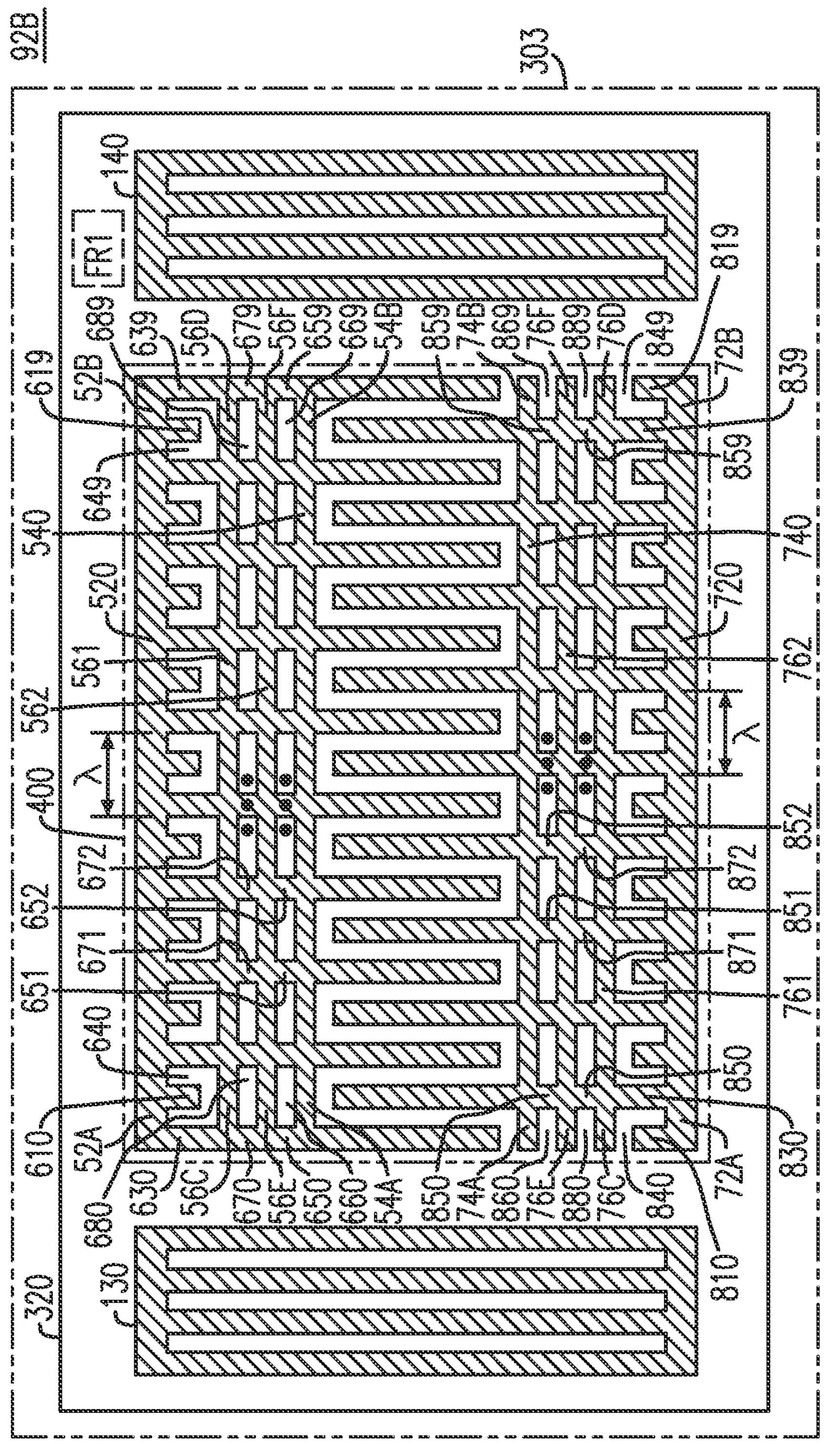
FIG. 15 is a schematic diagram showing an implementation structure of the signal processing system shown in FIG. 13.
Figure 16:
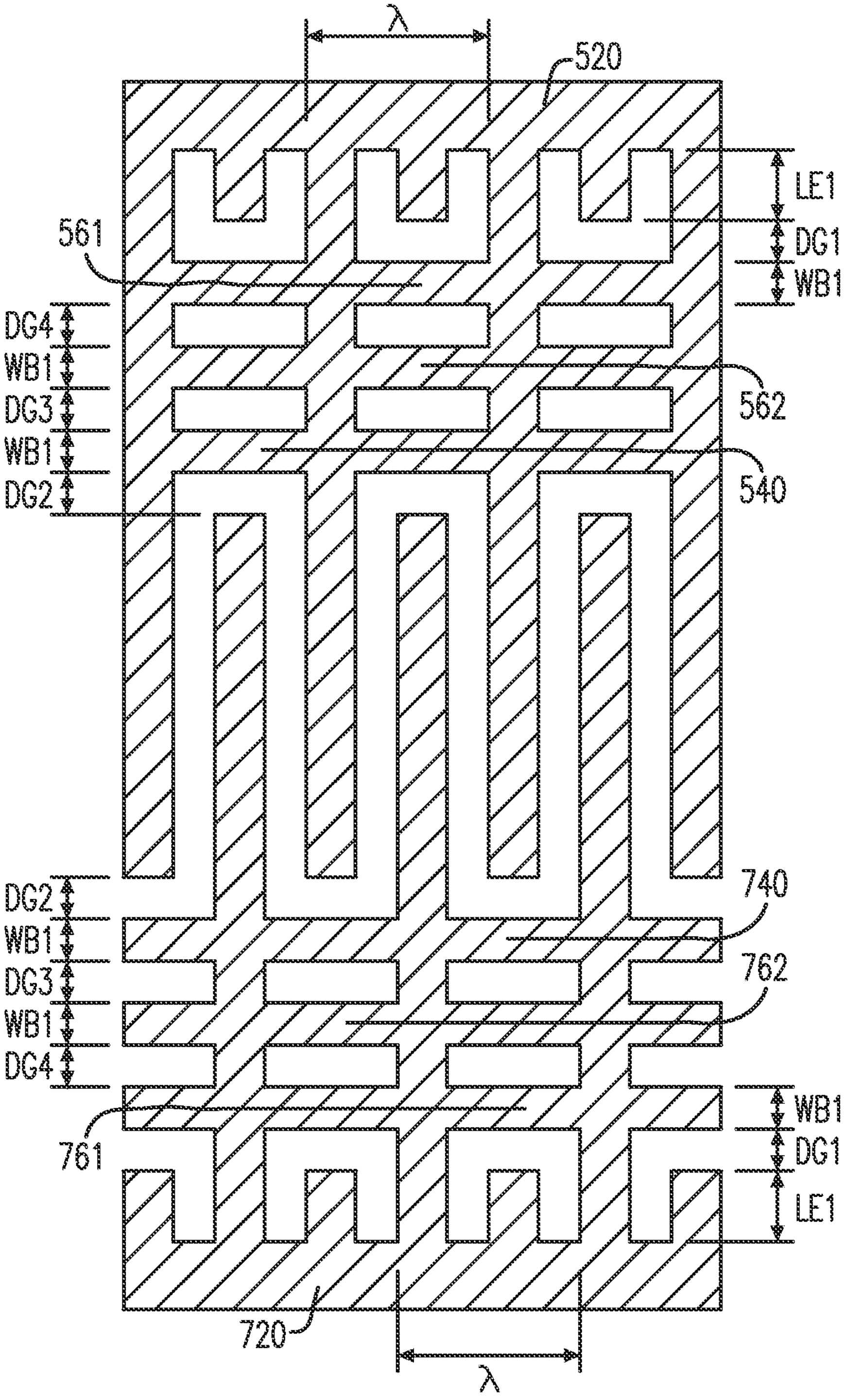
FIG. 16 is a schematic diagram showing a partial structure of an interdigital transducer shown in FIG. 13.

Please refer to FIG. 14, FIG. 15 and FIG. 16. FIG. 14 is a schematic diagram showing an implementation structure 92A of the signal processing system 920 shown in FIG. 13. FIG. 15 is a schematic diagram showing an implementation structure 92B of the signal processing system 920 shown in FIG. 13. FIG. 16 is a schematic diagram showing a partial structure of the interdigital transducer 400 shown in FIG. 13. As shown in FIG. 14 and FIG. 15, each of the implementation structure 92A and the implementation structure 92B includes the SAW resonator 303.

In some embodiments, the first conductive bar 540 and the first plurality of inner bars 561, 562, . . . are all substantially parallel with the first bus bar 520. The first conductive grid 500 further includes a first plurality of conductive connection segments 631, 632, . . . . The first plurality of conductive connection segments 631, 632, . . . are disposed between the first bus bar 520 and the first plurality of inner bars 561, 562, . . . , are aligned with the first plurality of practical electrodes 451, 452, . . . respectively, and are interlaced with the first plurality of dummy electrodes 611, 612, . . . . For example, the first plurality of conductive connection segments 631, 632, . . . are electrically connected to the first bus bar 520 and the first plurality of inner bars 561, 562, . . . , and directly extend between the first bus bar 520 and the first plurality of inner bars 561, 562, . . . .

The interdigital transducer 400 further includes a second conductive grid 700 and a second plurality of practical electrodes 471, 472, . . . . The second conductive grid 700 is opposite to the first conductive grid 500, and includes a second bus bar 720 disposed on a first side 702 of the second conductive grid 700, a second plurality of dummy electrodes 811, 812, . . . directly extending from the second bus bar 720, a second conductive bar 740 disposed on a second side 704 of the second conductive grid 700, and a second plurality of inner bars 761, 762, . . . (or 761 and 762) disposed between the second bus bar 720 and the second conductive bar 740. The second bus bar 720 has a second signal transmission terminal 727. The second conductive bar 740 is opposite to the second bus bar 720; or the second conductive bar 740 is disposed on the second side 704 and is opposite to the second bus bar 720.

The second plurality of practical electrodes 471, 472, . . . all extend from the second conductive bar 740, and are interlaced with the first plurality of practical electrodes 451, 452, . . . . The second conductive bar 740 and the second plurality of inner bars 761, 762, . . . are all substantially parallel with the second bus bar 720. The first plurality of dummy electrodes 611, 612, . . . are aligned with the second plurality of practical electrodes 471, 472, . . . respectively. The second plurality of dummy electrodes 811, 812, . . . are aligned with the first plurality of practical electrodes 451, 452, . . . respectively.

For example, the first conductive grid 500 and the second conductive grid 700 respectively include a first effective reflecting structure and a second effective reflecting structure. The first effective reflecting structure includes the first conductive bar 540 and the first plurality of inner bars 561, 562, . . . , and is used to cause the SAW resonator 303 to have desired output power stability in a resonance frequency range. The second effective reflecting structure includes the second conductive bar 740 and the second plurality of inner bars 761, 762, . . . , and is used to cause the SAW resonator 303 to have desired output power stability in the resonance frequency range.

In some embodiments, the second conductive grid 700 further includes a second plurality of conductive connection segments 831, 832, . . . . The second plurality of conductive connection segments 831, 832, . . . are disposed between the second bus bar 720 and the second plurality of inner bars 761, 762, . . . , are aligned with the second plurality of practical electrodes 471, 472, . . . respectively, and are interlaced with the second plurality of dummy electrodes 811, 812, . . . . The first plurality of practical electrodes 451, 452, . . . have a periodic electrode distance λ. Each of the first plurality of dummy electrodes 611, 612, . . . and a nearby one of the first plurality of inner bars 561, 562, . . . have a first gap distance DG1 therebetween which ranges from 0.0625λ to 0.5λ. The first conductive bar 540 and each of the second plurality of practical electrodes 471, 472, . . . have a second gap distance DG2 therebetween which ranges from 0.0625λ to 0.5λ. For example, the first plurality of inner bars 561, 562, . . . are respectively a plurality of conductive inner bars. A number N1 of the first plurality of inner bars 561, 562, . . . is greater than or equal to 2. For example, the second plurality of conductive connection segments 831, 832, . . . are electrically connected to the second bus bar 720 and the second plurality of inner bars 761, 762, . . . , and directly extend between the second bus bar 720 and the second plurality of inner bars 761, 762, . . . .

The SAW resonator 303 further has a specific resonance frequency FR1. The specific resonance frequency FR1 ranges from 30 MHz to 6 GHz. Each of the first plurality of dummy electrodes 611, 612, . . . has an electrode length LE1 which ranges from 0.1λ to 5λ. Each of the first conductive bar 540 and the first plurality of inner bars 561, 562, . . . has a bar width WB1 which ranges from 0.0625λ to 0.5λ. The first conductive bar 540 and a nearby one of the first plurality of inner bars 561, 562, . . . have a third gap distance DG3 therebetween which ranges from 0.0625λ to 0.5λ. The first plurality of inner bars 561, 562, . . . include a first inner bar 561 and a second inner bar 562 being adjacent to the first inner bar 561. The first inner bar 561 and the second inner bar 562 have a fourth gap distance DG4 therebetween which ranges from 0.0625λ to 0.5λ.

In some embodiments, the SAW resonator 303 includes a substrate 320 and the interdigital transducer 400 disposed on the substrate 320. For example, the substrate 320 is a piezoelectric substrate. The interdigital transducer 400 includes the first conductive grid 500 and the first plurality of practical electrodes 451, 452, . . . .

In some embodiments, each of the second plurality of dummy electrodes 811, 812, . . . and a nearby one of the second plurality of inner bars 761, 762, . . . have the first gap distance DG1 therebetween. The second conductive bar 740 and each of the first plurality of practical electrodes 451,

452, . . . have the second gap distance DG2 therebetween. Each of the second conductive bar 740 and the second plurality of inner bars 761, 762, . . . has the bar width WB1. The second conductive bar 740 and each of the second plurality of inner bars 761, 762, . . . have the third gap distance DG3 therebetween. The second plurality of inner bars 761, 762, . . . include an inner bar 761 and an inner bar 762 being adjacent to the inner bar 761. The inner bar 761 and the inner bar 762 have the fourth gap distance DG4 therebetween. For example, the second plurality of inner bars 761, 762, . . . are respectively a plurality of conductive inner bars. A number N1 of the second plurality of inner bars 761, 762, . . . is greater than or equal to 2.

The SAW resonator 303 has a SAW propagation direction. The first conductive bar 540 has a first longitudinal direction. The first longitudinal direction is substantially parallel with the SAW propagation direction. The second conductive bar 740 has a second longitudinal direction. The second longitudinal direction is substantially parallel with the SAW propagation direction. The first inner bar 561, the second inner bar 562, the inner bar 761 and the inner bar 762 respectively have a third longitudinal direction, a fourth longitudinal direction, a fifth longitudinal direction and a sixth longitudinal direction. Each of the third longitudinal direction, the fourth longitudinal direction, the fifth longitudinal direction and the sixth longitudinal direction is substantially parallel with the SAW propagation direction.

In some embodiments, the interdigital transducer 400 has a first outer side in the SAW propagation direction and a second outer side being opposite to the first outer side. The SAW resonator 303 further includes a reflector 130 disposed on the first outer side and a reflector 140 disposed on the second outer side. For example, the reflector 140 is opposite to the reflector 130, and matches the reflector 130. For example, the first plurality of practical electrodes 451, 452, . . . are arranged based on a first interlacing overlap length. The second plurality of practical electrodes 471, 472, . . . are arranged based on a second interlacing overlap length. The second interlacing overlap length is configured to be equal to the first interlacing overlap length to cause the data transmission to optimize.

The first conductive grid 500 further includes a plurality of conductive connection segments 651, 652, . . . . The plurality of conductive connection segments 651, 652, . . . are disposed between the first conductive bar 540 and the first plurality of inner bars 561, 562, . . . and are aligned with the first plurality of practical electrodes 451, 452, . . . respectively. For example, the plurality of conductive connection segments 651, 652, . . . are electrically connected to the first conductive bar 540 and the first plurality of inner bars 561, 562, . . . , and directly extend between the first conductive bar 540 and the first plurality of inner bars 561, 562, . . . . The second conductive grid 700 further includes a plurality of conductive connection segments 851, 852, . . . . The plurality of conductive connection segments 851, 852, . . . are disposed between the second conductive bar 740 and the second plurality of inner bars 761, 762, . . . , and are aligned with the second plurality of practical electrodes 471, 472, . . . respectively. For example, the plurality of conductive connection segments 851, 852, . . . are electrically connected to the second conductive bar 740 and the second plurality of inner bars 761, 762, . . . , and directly extend between the second conductive bar 740 and the second plurality of inner bars 761, 762, . . . .

The first conductive grid 500 further includes a plurality of conductive connection segments 671, 672, . . . . The plurality of conductive connection segments 671, 672, . . . are disposed between the first inner bar 561 and the second inner bar 562, and are aligned with the first plurality of practical electrodes 451, 452, . . . respectively. For example, the plurality of conductive connection segments 671, 672, . . . are connected to the first inner bar 561 and the second inner bar 562, and directly extend between the first inner bar 561 and the second inner bar 562. The second conductive grid 700 further includes a plurality of conductive connection segments 871, 872, . . . . The plurality of conductive connection segments 871, 872, . . . are disposed between the inner bar 761 and the inner bar 762, and are aligned with the second plurality of practical electrodes 471, 472, . . . respectively. For example, the plurality of conductive connection segments 871, 872, . . . are electrically connected to the inner bar 761 and the inner bar 762, and directly extend between the inner bar 761 and the inner bar 762.

In some embodiments, the first bus bar 520 includes a bar terminal segment 52A and a bar terminal segment 52B being opposite to the bar terminal segment 52A. The first inner bar 561 includes a bar terminal segment 56C and a bar terminal segment 56D being opposite to the bar terminal segment 56C. The first plurality of dummy electrodes 611, 612, . . . include a dummy electrode 610 directly extending from the bar terminal segment 52A, and a dummy electrode 619 directly extending from the bar terminal segment 52B. The first plurality of conductive connection segments 631, 632, . . . include a first specific connection segment 630 and a second specific connection segment being adjacent to the first specific connection segment 630. Each of the first specific connection segment 630 and the second specific connection segment is directly electrically connected to the bar terminal segment 52A, and is directly electrically connected to the bar terminal segment 56C. At least one of the bar terminal segment 52A, the dummy electrode 610, the first specific connection segment 630, the second specific connection segment and the bar terminal segment 56C is used to cause the first conductive grid 500 to form a closed gap 640 between the bar terminal segment 52A and the bar terminal segment 56C.

The first plurality of conductive connection segments 631, 632, . . . further include a third specific connection segment 639 and a fourth specific connection segment being adjacent to the third specific connection segment 639. Each of the third specific connection segment 639 and the fourth specific connection segment is directly electrically connected to the bar terminal segment 52B, and is directly electrically connected to the bar terminal segment 56D. At least one of the bar terminal segment 52B, the dummy electrode 619, the third specific connection segment 639, the fourth specific connection segment and the bar terminal segment 56D is used to cause the first conductive grid 500 to form a closed gap 649 between the bar terminal segment 52B and the bar terminal segment 56D. For example, the closed gap 640 and the closed gap 649 are respectively two U-shaped gaps.

In some embodiments, the second bus bar 720 includes a bar terminal segment 72A and a bar terminal segment 72B being opposite to the bar terminal segment 72A. The inner bar 761 includes a bar terminal segment 76C and a bar terminal segment 76D being opposite to the bar terminal segment 76C. The second plurality of dummy electrodes 811, 812, . . . include a dummy electrode 810 directly extending from the bar terminal segment 72A, and a dummy electrode 819 directly extending from the bar terminal segment 72B. The second plurality of conductive connection segments 831, 832, . . . include a fifth specific connection segment 830. The fifth specific connection segment 830 is directly electrically connected to the bar terminal segment 72A and the bar terminal segment 76C. At least one of the bar terminal segment 72A, the dummy electrode 810, the fifth specific connection segment 830 and the bar terminal segment 76C is used to cause the second conductive grid 700 to form an open gap 840 between the bar terminal segment 72A and the bar terminal segment 76C.

The second plurality of conductive connection segments 831, 832, . . . further include a sixth specific connection segment 839. The sixth specific connection segment 839 is directly electrically connected to the bar terminal segment 72B and the bar terminal segment 76D. At least one of the bar terminal segment 72B, the dummy electrode 819, the sixth specific connection segment 839 and the bar terminal segment 76D is used to cause the second conductive grid 700 to form an open gap 849 between the bar terminal segment 72B and the bar terminal segment 76D. For example, the open gap 840 and the open gap 849 are respectively two L-shaped gaps. For example, the first conductive grid 500 and the first plurality of practical electrodes 451, 452, . . . are formed in one piece, and have the same material. The second conductive grid 700 and the second plurality of practical electrodes 471, 472, . . . are formed in one piece, and have the same material.

In some embodiments, the first conductive bar 540 includes a bar terminal segment 54A and a bar terminal segment 54B being opposite to the bar terminal segment 54A. The second inner bar 562 includes a bar terminal segment 56E and a bar terminal segment 56F being opposite to the bar terminal segment 56E. The plurality of conductive connection segments 651, 652, . . . include a first specific connection segment 650 and a second specific connection segment being adjacent to the first specific connection segment 650. Each of the first specific connection segment 650 and the second specific connection segment is directly electrically connected to the bar terminal segment 54A, and is directly electrically connected to the bar terminal segment 56E. At least one of the bar terminal segment 54A, the first specific connection segment 650, the second specific connection segment and the bar terminal segment 56E is used to cause the first conductive grid 500 to form a closed gap 660 between the bar terminal segment 54A and the bar terminal segment 56E.

The plurality of conductive connection segments 651, 652, . . . further include a third specific connection segment 659 and a fourth specific connection segment being adjacent to the third specific connection segment 659. Each of the third specific connection segment 659 and the fourth specific connection segment is directly electrically connected to the bar terminal segment 54B, and is directly electrically connected to the bar terminal segment 56F. At least one of the bar terminal segment 54B, the third specific connection segment 659, the fourth specific connection segment and the bar terminal segment 56F is used to cause the first conductive grid 500 to form a closed gap 669 between the bar terminal segment 54B and the bar terminal segment 56F.

In some embodiments, the second conductive bar 740 includes a bar terminal segment 74A and a bar terminal segment 74B being opposite to the bar terminal segment 74A. The inner bar 762 includes a bar terminal segment 76E and a bar terminal segment 76F being opposite to the bar terminal segment 76E. The plurality of conductive connection segments 851, 852, . . . include a fifth specific connection segment 850. The fifth specific connection segment 850 is directly electrically connected to the bar terminal segment 74A and the bar terminal segment 76E. At least one of the bar terminal segment 74A, the fifth specific connection segment 850 and the bar terminal segment 76E is used to cause the second conductive grid 700 to form an open gap 860 between the bar terminal segment 74A and the bar terminal segment 76E.

The plurality of conductive connection segments 851, 852, . . . further include a sixth specific connection segment 859. The sixth specific connection segment 859 is directly electrically connected to the bar terminal segment 74B and the bar terminal segment 76F. At least one of the bar terminal segment 74B, the sixth specific connection segment 859 and the bar terminal segment 76F is used to cause the second conductive grid 700 to form an open gap 869 between the bar terminal segment 74B and the bar terminal segment 76F.

In some embodiments, the plurality of conductive connection segments 671, 672, . . . include a first specific connection segment 670 and a second specific connection segment being adjacent to the first specific connection segment 670. Each of the first specific connection segment 670 and the second specific connection segment is directly electrically connected to the bar terminal segment 56C, and is directly electrically connected to the bar terminal segment 56E. At least one of the bar terminal segment 56C, the first specific connection segment 670, the second specific connection segment and the bar terminal segment 56E is used to cause the first conductive grid 500 to form a closed gap 680 between the bar terminal segment 56C and the bar terminal segment 56E.

The plurality of conductive connection segments 671, 672, . . . further include a third specific connection segment 679 and a fourth specific connection segment being adjacent to the third specific connection segment 679. Each of the third specific connection segment 679 and the fourth specific connection segment is directly electrically connected to the bar terminal segment 56D, and is directly electrically connected to the bar terminal segment 56F. At least one of the bar terminal segment 56D, the third specific connection segment 679, the fourth specific connection segment and the bar terminal segment 56F is used to cause the first conductive grid 500 to form a closed gap 689 between the bar terminal segment 56D and the bar terminal segment 56F.

In some embodiments, the plurality of conductive connection segments 871, 872, . . . include a fifth specific connection segment 870. The fifth specific connection segment 870 is directly electrically connected to the bar terminal segment 76C and the bar terminal segment 76E. At least one of the bar terminal segment 76C, the fifth specific connection segment 870 and the bar terminal segment 76E is used to cause the second conductive grid 700 to form an open gap 880 between the bar terminal segment 76C and the bar terminal segment 76E.

The plurality of conductive connection segments 871, 872, . . . further include a sixth specific connection segment 879. The sixth specific connection segment 879 is directly electrically connected to the bar terminal segment 76D and the bar terminal segment 76F. At least one of the bar terminal segment 76D, the sixth specific connection segment 879 and the bar terminal segment 76F is used to cause the second conductive grid 700 to form an open gap 889 between the bar terminal segment 76D and the bar terminal segment 76F.

Figure 17:
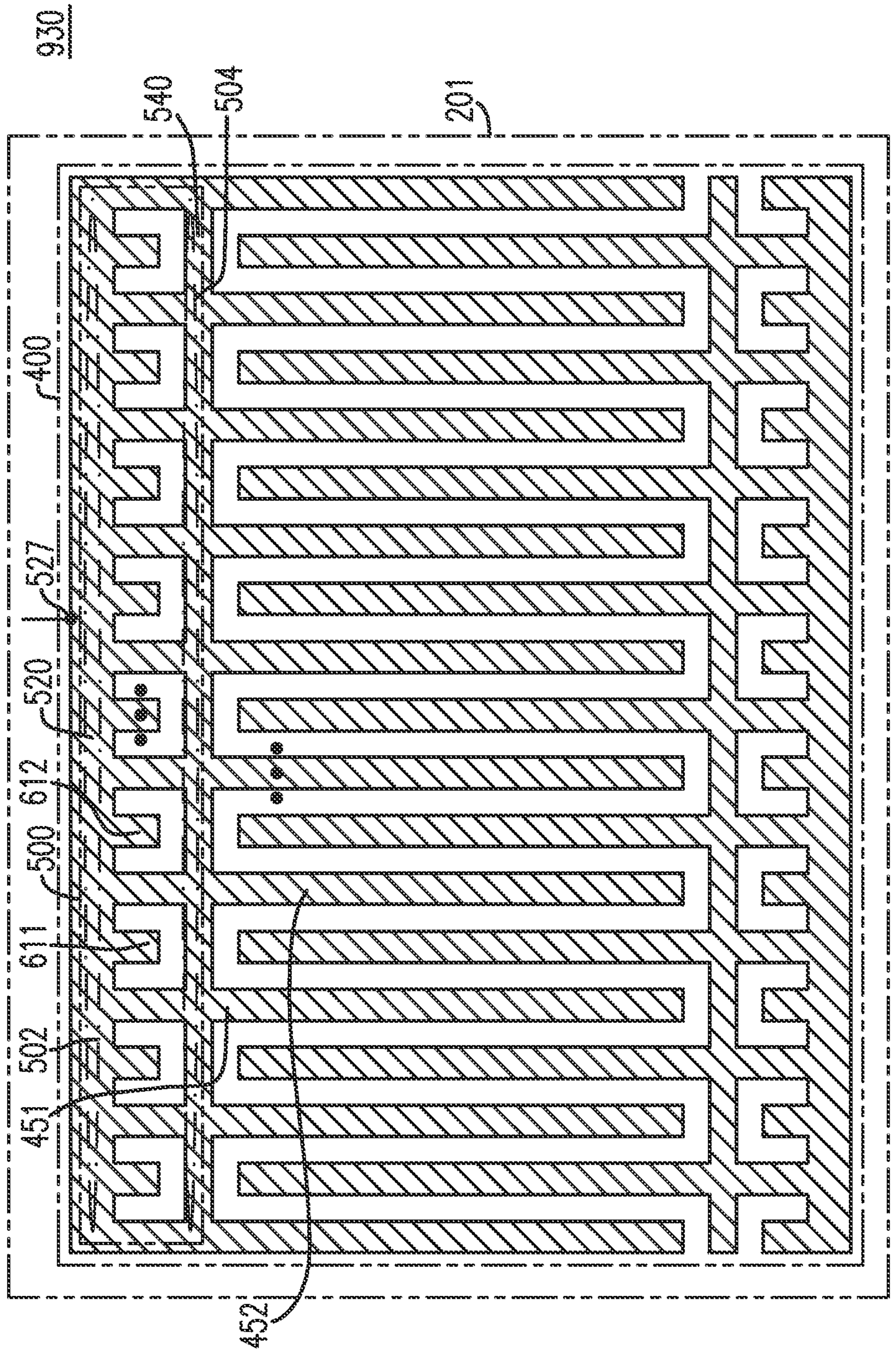
FIG. 17, which is a schematic diagram showing a signal processing system according to various embodiments of the present disclosure.

Please refer to FIG. 17, which is a schematic diagram showing a signal processing system 930 according to various embodiments of the present disclosure. As shown in FIG. 17, the signal processing system 930 includes a surface-acoustic-wave (SAW) filter 201. The SAW filter 201 includes an interdigital transducer 400. The interdigital transducer 400 includes a first conductive grid 500 and a first plurality of practical electrodes 451, 452, . . . . The first conductive grid 500 includes a first bus bar 520 disposed on a first side 502 of the first conductive grid 500, a first plurality of dummy electrodes 611, 612, . . . directly extending from the first bus bar 520, and a first conductive bar 540 disposed on a second side 504 of the first conductive grid 500. The first bus bar 520 has a first signal transmission terminal 527. The first conductive bar 540 is opposite to the first bus bar 520; or the first conductive bar 540 is disposed on the second side 504 and is opposite to the first bus bar 520. The first plurality of practical electrodes 451, 452, . . . respectively extend from the first conductive bar 540.

Figure 18:
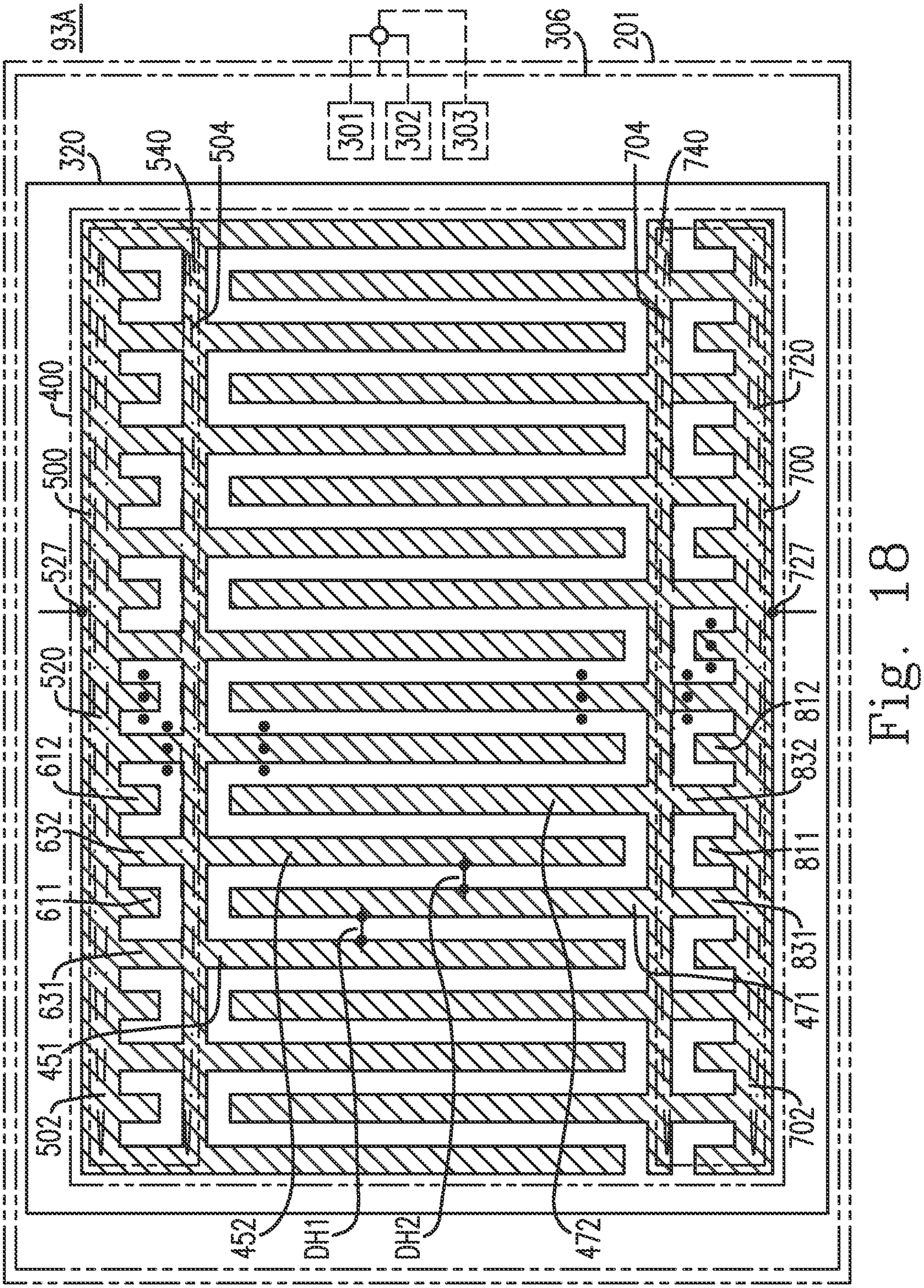
FIG. 18, which is a schematic diagram showing an implementation structure of the signal processing system shown in FIG. 17.

Please refer to FIG. 18, which is a schematic diagram showing an implementation structure 93A of the signal processing system 930 shown in FIG. 17. In some embodiments, the SAW filter 201 includes a specific resonator 306. The specific resonator 306 is equal to one selected from a group consisting of the SAW resonators 301, 302 and 303, and includes the interdigital transducer 400. The first conductive bar 540 is substantially parallel with the first bus bar 520. The first conductive grid 500 further includes a first plurality of conductive connection segments 631, 632, . . . . The first plurality of conductive connection segments 631, 632, . . . are disposed between the first bus bar 520 and the first conductive bar 540, are aligned with the first plurality of practical electrodes 451, 452, . . . respectively, and are interlaced with the first plurality of dummy electrodes 611, 612, . . . . For example, the first plurality of conductive connection segments 631, 632, . . . are electrically connected to the first bus bar 520 and the first conductive bar 540, and directly extend between the first bus bar 520 and the first conductive bar 540.

The interdigital transducer 400 is disposed on a piezoelectric substrate 320, and further includes a second conductive grid 700 and a second plurality of practical electrodes 471, 472, . . . . The second conductive grid 700 is opposite to the first conductive grid 500, and includes a second bus bar 720 disposed on a first side 702 of the second conductive grid 700, a second plurality of dummy electrodes 811, 812, . . . directly extending from the second bus bar 720, and a second conductive bar 740 disposed on a second side 704 of the second conductive grid 700. The second bus bar 720 has a second signal transmission terminal 727. The second conductive bar 740 is opposite to the second bus bar 720; or the second conductive bar 740 is disposed on the second side 704 and is opposite to the second bus bar 720. For example, the first and the second conductive bars 540 and 740 are respectively two reflecting bars. The second side 504 is opposite to the first side 502. The second side 704 is opposite to the first side 702. The first and the second conductive bars 540 and 740 respectively serve as two effective reflecting structures to cause the SAW filter 201 to have desired output power stability in a specific filtering frequency range.

Figure 19:
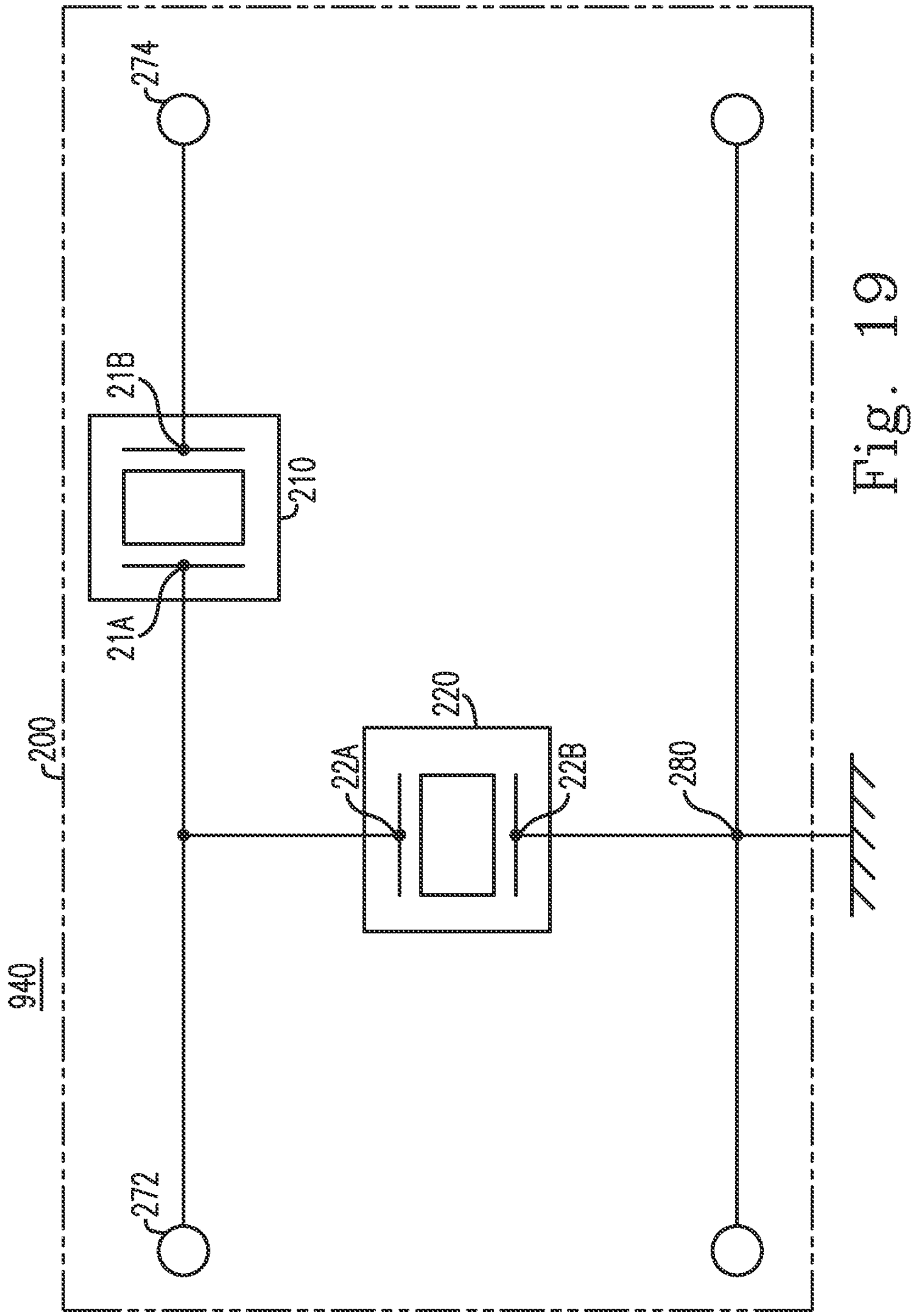
FIG. 19, which is a schematic diagram showing a signal processing system according to various embodiments of the present disclosure.

Please refer to FIG. 19, which is a schematic diagram showing a signal processing system 940 according to various embodiments of the present disclosure. As shown in FIG. 19, the signal processing system 940 includes a surface-acoustic-wave (SAW) filter 200. The SAW filter 200 has a first port 272, a second port 274 and a ground terminal 280, and includes a series resonator 210 and a shunt resonator 220 coupled to the series resonator 210. For example, the SAW filter 200 is the SAW filter 201.

The series resonator 210 has a signal transmission terminal 21A and a signal transmission terminal 21B being opposite to the signal transmission terminal 21A, and is coupled between the first port 272 and the second port 274 in series. For example, the signal transmission terminal 21A is electrically connected to the first port 272. The signal transmission terminal 21B is electrically connected to the second port 274. The shunt resonator 220 has a signal transmission terminal 22A and a signal transmission terminal 22B being opposite to the signal transmission terminal 22A, and is coupled between the first port 272 and the ground terminal 280. For example, the signal transmission terminal 22A is electrically connected to the signal transmission terminal 21A. The signal transmission terminal 22B is electrically connected to the ground terminal 280. The first port 272 and the second port 274 are respectively an input port and an output port.

In some embodiments, the series resonator 210 is the same as any of the SAW resonators 301, 302 and 303. Under a condition that the series resonator 210 is the same as any of the SAW resonators 301, 302 and 303, the signal transmission terminal 21A and the signal transmission terminal 21B are respectively the same as the first signal transmission terminal 527 and the second signal transmission terminal 727. For example, the shunt resonator 220 is the same as any of the SAW resonators 301, 302 and 303. Under a condition that the shunt resonator 220 is the same as any of the SAW resonators 301, 302 and 303, the signal transmission terminal 21A and the signal transmission terminal 21B are respectively the same as the first signal transmission terminal 527 and the second signal transmission terminal 727.

In some embodiments, as shown in FIG. 14, the first plurality of inner bars 561, 562, . . . are disposed between the first plurality of dummy electrodes 611, 612, . . . and the first conductive bar 540. A number N1 of the first plurality of inner bars 561, 562, . . . can be increased or decreased according to an application demand. Any of the SAW resonators 301, 302 and 303 can be included in the SAW filter 200. For example, the SAW filter 200 is a SAW ladder filter, and is disposed on the piezoelectric substrate 320. For example, the SAW filter 200 includes the piezoelectric substrate 320. Any of the SAW resonators 301, 302 and 303 has a specific structure. The specific structure is used to obtain a high quality factor value (Q value) and a low insertion loss, and is used to optimize the band-pass amplitude.

While the invention has been described in terms of what is presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A surface-acoustic-wave (SAW) resonator comprising:
- a substrate; and
- an interdigital transducer disposed on the substrate, and including:
  - a first conductive grid including:
    - a first bus bar having a first signal transmission terminal, and disposed on a first side of the first conductive grid;
    - a first plurality of dummy electrodes directly extending from the first bus bar;
    - a first conductive bar disposed on a second side of the first conductive grid, and being opposite to the first bus bar;
    - a first plurality of inner bars disposed between the first bus bar and the first conductive bar; and
  - a first plurality of conductive connection segments electrically connected to the first bus bar and the first plurality of inner bars, directly extending between the first bus bar and the first plurality of inner bars, and interlaced with the first plurality of dummy electrodes; and a first plurality of practical electrodes, each of which extends from the first conductive bar, wherein:

the first plurality of practical electrodes have a periodic electrode distance λ; and each of the first plurality of dummy electrodes and a nearby one of the first plurality of inner bars have a first gap distance therebetween which ranges from 0.0625λ to 0.5λ.

2. The SAW resonator according to claim 1, wherein:

the substrate is a piezoelectric substrate;

the first conductive bar and the first plurality of inner bars are both substantially parallel with the first bus bar; and the first plurality of conductive connection segments are aligned with the first plurality of practical electrodes respectively.

3. The SAW resonator according to claim 2, wherein:

the interdigital transducer further comprises a second conductive grid and a second plurality of practical electrodes;

the second conductive grid is opposite to the first conductive grid, and comprises:

a second bus bar having a second signal transmission terminal, and disposed on a first side of the second conductive grid;

a second plurality of dummy electrodes directly extending from the second bus bar;

a second conductive bar disposed on a second side of the second conductive grid, and being opposite to the second bus bar; and a second plurality of inner bars disposed between the second bus bar and the second conductive bar; and the second plurality of practical electrodes all extend from the second conductive bar, and are interlaced with the first plurality of practical electrodes.

4. The SAW resonator according to claim 3, wherein:

the second conductive bar and the second plurality of inner bars are both substantially parallel with the second bus bar;

the first plurality of dummy electrodes are aligned with the second plurality of practical electrodes respectively; and the second plurality of dummy electrodes are aligned with the first plurality of practical electrodes respectively.

5. The SAW resonator according to claim 3, wherein:

the second conductive grid further comprises a second plurality of conductive connection segments; and the second plurality of conductive connection segments are electrically connected to the second bus bar and the second plurality of inner bars, directly extend between the second bus bar and the second plurality of inner bars, are aligned with the second plurality of practical electrodes respectively, and are interlaced with the second plurality of dummy electrodes.

6. The SAW resonator according to claim 5, wherein:

the first conductive bar and each of the second plurality of practical electrodes have a second gap distance therebetween which ranges from 0.0625λ to 0.5λ.

7. The SAW resonator according to claim 6, further having a specific resonance frequency, wherein:

the specific resonance frequency ranges from 30 MHz to 6 GHz;

each of the first plurality of dummy electrodes has an electrode length ranging from 0.1λ to 5λ;

each of the first conductive bar and the first plurality of inner bars has a bar width ranging from 0.0625λ to 0.5λ;

the first conductive bar and a nearby one of the first plurality of inner bars have a third gap distance therebetween which ranges from 0.0625λ to 0.5λ;

the first plurality of inner bars include a first inner bar and a second inner bar being adjacent to the first inner bar; and the first inner bar and the second inner bar have a fourth gap distance therebetween which ranges from 0.0625λ to 0.5λ.

8. A surface-acoustic-wave (SAW) resonator, comprising:

a substrate; and an interdigital transducer disposed on the substrate, and including:

a first conductive grid including:

a first bus bar having a first signal transmission terminal, and disposed on a first side of the first conductive grid;

a first plurality of dummy electrodes directly extending from the first bus bar;

a first conductive bar disposed on a second side of the first conductive grid, and being opposite to the first bus bar;

a first inner bar disposed between the first bus bar and the first conductive bar; and a first plurality of conductive connection segments electrically connected to the first bus bar and the first inner bar, directly extending between the first bus bar and the first inner bar, and interlaced with the first plurality of dummy electrodes; and a first plurality of practical electrodes, each of which extends from the first conductive bar, wherein:

the first plurality of practical electrodes have a periodic electrode distance λ; and each of the first plurality of dummy electrodes and the first inner bar have a first gap distance therebetween which ranges from 0.0625λ to 0.5λ.

9. The SAW resonator according to claim 8, wherein:

the substrate is a piezoelectric substrate;

the first inner bar and the first conductive bar are both substantially parallel with the first bus bar; and the first plurality of conductive connection segments are aligned with the first plurality of practical electrodes respectively.

10. The SAW resonator according to claim 9, wherein:

the interdigital transducer further comprises a second conductive grid and a second plurality of practical electrodes;

the second conductive grid is opposite to the first conductive grid, and comprises:

a second bus bar having a second signal transmission terminal, and disposed on a first side of the second conductive grid;

a second plurality of dummy electrodes directly extending from the second bus bar;

a second conductive bar disposed on a second side of the second conductive grid, and being opposite to the second bus bar; and a second inner bar disposed between the second bus bar and the second conductive bar, wherein the first conductive bar, the second conductive bar, the first inner bar and the second inner bar are reflecting bars; and the second plurality of practical electrodes all extend from the second conductive bar, and are interlaced with the first plurality of practical electrodes.

11. The SAW resonator according to claim 10, wherein:

the second inner bar and the second conductive bar are both substantially parallel with a second bus bar;

the first plurality of dummy electrodes are aligned with the second plurality of practical electrodes respectively; and the second plurality of dummy electrodes are aligned with the first plurality of practical electrodes respectively.

12. The SAW resonator according to claim 10, wherein:

the second conductive grid further comprises a second plurality of conductive connection segments; and the second plurality of conductive connection segments are electrically connected to the second bus bar and the second inner bar, directly extend between the second bus bar and the second inner bar, are aligned with the second plurality of practical electrodes respectively, and are interlaced with the second plurality of dummy electrodes.

13. The SAW resonator according to claim 12, wherein:

the first conductive bar and each of the second plurality of practical electrodes have a second gap distance therebetween which ranges from 0.0625λ to 0.5λ.

14. The SAW resonator according to claim 13, further having a specific resonance frequency, wherein:

the specific resonance frequency ranges from 30 MHz to 6 GHz;

each of the first plurality of dummy electrodes has an electrode length ranging from 0.1λ to 5λ;

each of the first conductive bar and the first inner bar has a bar width ranging from 0.0625λ to 0.5λ; and the first conductive bar and the first inner bar have a third gap distance therebetween which ranges from 0.0625λ to 0.5λ.

15. An interdigital transducer for a surface-acoustic-wave (SAW) resonator, the interdigital transducer comprising:

a first conductive grid including:

a first bus bar having a first signal transmission terminal, and disposed on a first side of the first conductive grid;

a first plurality of dummy electrodes directly extending from the first bus bar;

a first conductive bar disposed on a second side of the first conductive grid, and being opposite to the first bus bar; and a first plurality of conductive connection segments electrically connected to the first bus bar and the first conductive bar, directly extending between the first bus bar and the first conductive bar, and interlaced with the first plurality of dummy electrodes; and a first plurality of practical electrodes, each of which extends from the first conductive bar, wherein:

the first plurality of practical electrodes have a periodic electrode distance λ; and each of the first plurality of dummy electrodes and the first conductive bar have a first gap distance therebetween which ranges from 0.0625λ to 0.5λ.

16. The interdigital transducer according to claim 15, wherein:

the first conductive bar is substantially parallel with the first bus bar; and the first plurality of conductive connection segments are aligned with the first plurality of practical electrodes respectively.

17. The interdigital transducer according to claim 16, wherein:

the interdigital transducer is disposed on a piezoelectric substrate, and further comprises a second conductive grid and a second plurality of practical electrodes;

the second conductive grid is opposite to the first conductive grid, and comprises:

a second bus bar having a second signal transmission terminal, and disposed on a first side of the second conductive grid;

a second plurality of dummy electrodes directly extending from the second bus bar; and a second conductive bar disposed on a second side of the second conductive grid, and being opposite to the second bus bar, wherein the first and the second conductive bars are respectively two reflecting bars; and the second plurality of practical electrodes all extend from the second conductive bar, and are interlaced with the first plurality of practical electrodes.

18. The interdigital transducer according to claim 17, wherein:

the second conductive bar is substantially parallel with the second bus bar;

the first plurality of dummy electrodes are aligned with the second plurality of practical electrodes respectively; and the second plurality of dummy electrodes are aligned with the first plurality of practical electrodes respectively.

19. The interdigital transducer according to claim 17, wherein:

the second conductive grid further comprises a second plurality of conductive connection segments; and the second plurality of conductive connection segments are electrically connected to the second bus bar and the second conductive bar, directly extend between the second bus bar and the second conductive bar, are aligned with the second plurality of practical electrodes respectively, and are interlaced with the second plurality of dummy electrodes.

20. The interdigital transducer according to claim 19, further having a specific resonance frequency, wherein:

the specific resonance frequency ranges from 30 MHz to 6 GHz;

the first conductive bar and each of the second plurality of practical electrodes have a second gap distance therebetween which ranges from 0.0625λ to 0.5λ; and each of the first plurality of dummy electrodes has an electrode length ranging from 0.1λ to 5λ.

* * * * *